(12) United States Patent
Ohno

(10) Patent No.: US 6,501,119 B1
(45) Date of Patent: Dec. 31, 2002

(54) SEMICONDUCTOR MEMORY DEVICE AND METHOD OF PRODUCING SAME

(75) Inventor: Keiichi Ohno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/447,558

(22) Filed: Nov. 23, 1999

(30) Foreign Application Priority Data

Nov. 24, 1998 (JP) .......................................... 10-332790

(51) Int. Cl.$^7$ ........................ H01L 27/108; H01L 29/76
(52) U.S. Cl. ...................................... 257/306; 257/296
(58) Field of Search ................................. 257/303, 304, 257/305, 306, 296, 309; 438/238, 239, 386

(56) References Cited

U.S. PATENT DOCUMENTS 6,130,449 A * 10/2000 Matsuoka et al. .......... 257/296

* cited by examiner

Primary Examiner—Olik Chaudhuri
Assistant Examiner—DiLinh Nguyen
(74) Attorney, Agent, or Firm—Ronald P. Kananen; Radar, Fishman & Grauer

(57) ABSTRACT

A semiconductor memory device having a high quality storage node electrode preventing for example connection failure between a contact plug and the storage node electrode, including first insulating films formed on a substrate, storage node contact holes formed in the first insulating films, storage node contact plugs buried in the storage node contact holes, a storage node electrode formed connected to the storage node contact plug, and a second insulating film formed above the first insulating film at a gap of the storage node electrode, the storage node electrode and the storage node contact plug being connected at least at part of the top surface and the side surface of the storage node contact plug or the storage node electrode and the second inter-layer insulating film being in contact at least at part of the top surface and the side surface of the second insulating film, and a method for producing the same.

6 Claims, 24 Drawing Sheets

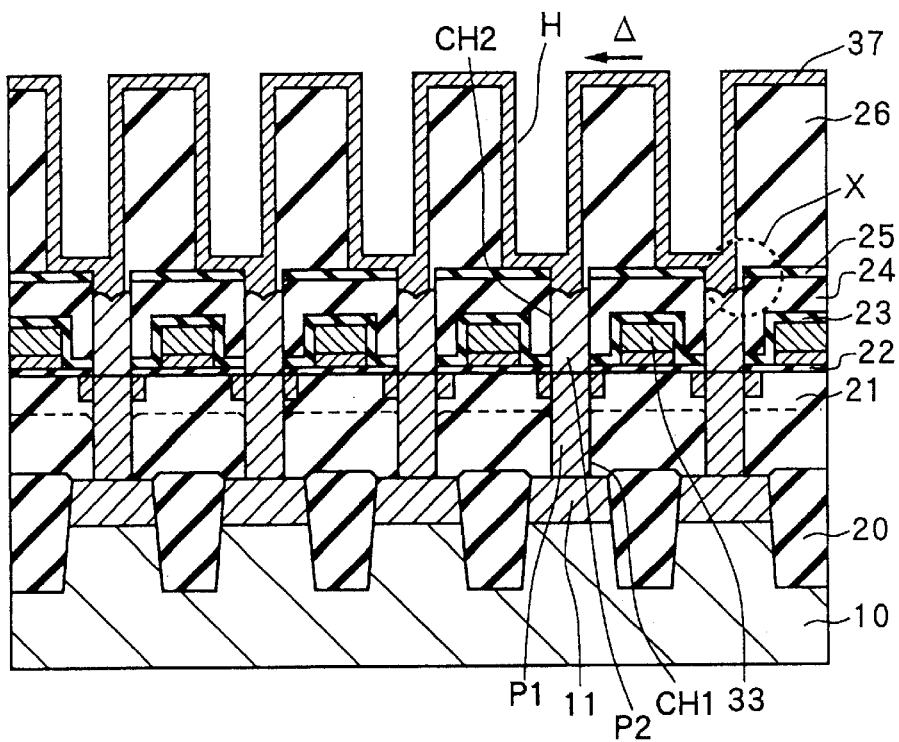
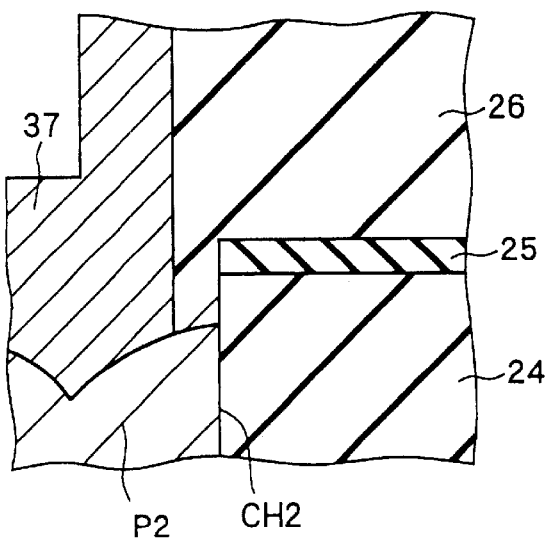
FIG.7A
FIG.7B

SEMICONDUCTOR MEMORY DEVICE AND METHOD OF PRODUCING SAME

BACKGROUND OF THE INVENTION

1. Field of the Invention

The present invention relates to a semiconductor memory device and a method for producing the same, more particularly relates to a dynamic random access memory (DRAM) or other semiconductor memory device having a storage node electrode and a method for producing the same.

2. Description of the Related Art

In recent very large scale integrated circuits (VLSI) and other semiconductor devices, reductions of scale of 70% have been realized in three years. Higher degrees of integration and higher performance have been achieved. For example, DRAMs have a memory cell structure having a switching use metal-oxide-semiconductor field effect transistor (MOSFET) and a memory capacitor. They have become increasingly miniaturized and reduced in size in recent years and have become increasingly large in capacity and higher in degree of integration as process drivers in semiconductor devices, for example, with DRAMs having a storage capacity of 1 Gb being announced at the academic level. Along with the miniaturization, the area of the memory cells has been reduced and the area occupied by the memory capacitors has been reduced.

However, in order to secure a sufficient operating margin and secure a tolerance to soft error due to alpha rays so as to raise the reliability of the stored data, the storage capacity Cs of the memory capacitor is held at a constant value of 20 to 30 fF per bit regardless of the generation of the DRAM.

Accordingly, irrespective of the fact that the area occupied by the memory capacitor has been reduced along with the miniaturization, the required amount of storage capacity Cs must be secured. Various attempts have been made to deal with this.

For example, other than the method of reducing the thickness of a capacitor insulating film so as to increase the storage capacity, a method has been developed of using as the capacitor insulating film tantalum oxide ($Ta_2O_5$), BST, STO, or the like having a high dielectric ratio in place of an ON film (or ONO film) comprising a composite film of a silicon nitride film and a silicon oxide film so as to improve the materials comprising the capacitor insulating film and increase the storage capacity of the capacitor.

On the other hand, improvements have been made to the electrode structure of the capacitor as well. Capacitors having various structures have been developed. A memory capacitor comprises a storage node electrode (electrode connected to the transistor of the capacitor), a plate electrode (grounded electrode of the capacitor), and a capacitor insulating film between them. By increasing the surface area of the storage node electrode and the plate electrode, it is possible to increase the storage capacity of the capacitor.

A planer type having a planar structure has been used in the related art, but at present, generally the storage node electrode is made three-dimensional to obtain a more complex shape, the side wall surfaces of the storage node electrode etc. are utilized, and therefore the surface area of the storage node electrode is increased to increase the storage capacity without increasing the occupied area of the capacitor. As a three-dimensional storage node electrode, there are for example a stack type, a trench type, etc.

In the trench type, the storage node electrode is formed in the depth direction with respect to the substrate, so it is necessary to investigate the adverse influence due to digging into the substrate. On the other hand, the stack type can be classified into two types, that is, the capacitor-over-bit line (COB) and the capacitor-under-bit line (CUB) type. Among them, in the case of the COB stack type, since the capacitor (storage node electrode) is formed after the bit line, there is the advantage that the largest capacitor (storage node electrode) determined by the miniaturization can be formed in the cell region.

As the COB stack type described above, a variety of types have been developed such as the pedestal stack type, fin type, and cylinder type (crown type). As the cylinder type, other than a type having a single cylindrical part, a type having a double cylindrical part has been developed. Further, similarly, a method of coarsening the storage node electrode surface in order to increase the surface area and a method of controlling the polycrystalline silicon electrode-forming temperature to providing semispherical roughness on the surface have been developed.

Among them, the cylinder type storage node electrode can make effective use of the peripheral length of the electrode as the surface area, therefore, despite the reduction of the occupied area, the storage capacity is easily secured. This makes it one of the electrode structures best suited to the miniaturization, increase of degree of integration, and reduction of size of semiconductor memory devices. The methods for forming cylinder type storage node electrodes may be roughly classified into methods of forming a side wall-shaped electrode in the side wall portion of for example a recessed type oxide film and methods of forming the electrode material at the inner wall of a recessed type oxide film. In general, the latter enables a larger exposure margin in lithography and a larger margin with respect to the focus depth, so is advantageous with respect to further miniaturization.

The methods of forming cylinder type storage node electrodes of the related art, however, suffer from several problems such as a difficulty in exposing the top face of the storage node contact plug and connection failure between the storage node contact plug and the storage node electrode and, even when there is no connection failure, inadvertent etching of the inter-layer insulating film and, in the worst case, a short circuiting of the bit line and the storage node. These will be explained in further detail later, along with the method of production of the related art, with reference to the attached drawings.

SUMMARY OF THE INVENTION

An object of the present invention is to provide a DRAM or other semiconductor memory device having a memory capacitor wherein provision is made of a high quality storage node electrode and storage node contact plug enabling prevention of the connection failure between the storage node contact plug and the storage node electrode and prevention of the removal of the insulating film below the etching stopper which is a cause of short-circuiting and a method for producing the same.

To attain the above object, according to a first aspect of the present invention, there is provided a semiconductor memory device comprising a plurality of memory cells each having a memory capacitor having a storage node electrode and a transistor, comprising a substrate, a transistor formed on said substrate, a first insulating film formed on said substrate covering said transistor, a storage node contact hole formed in said first insulating film and reaching a source and drain region of said transistor, a storage node contact plug buried in said storage node contact hole, a storage node electrode formed connected to said storage node contact plug, a second insulating film formed above said first insulating film in the gap portion of said storage node electrodes, a capacitor insulating film formed above said storage node electrode, and a plate electrode formed above said capacitor insulating film, said storage node electrode and said storage node contact plug being formed connected at least at part of the top surface and side surface of said storage node contact plug.

That is, according to the semiconductor memory device of this aspect of the present invention, the storage node electrode and the storage node contact plug are formed connected at least at part of the top surface and the side surface of the storage node contact plug. In the related art, they were connected at only the top surface of the storage node contact plug, therefore when the plug loss was large, it was sometimes difficult to sufficiently expose the top surface of the storage node contact plug. By connecting them at part of the top surface and the side surface of the storage node contact plug, it becomes possible to reliably connect the storage node electrode and the storage node contact plug.

In the semiconductor memory device of this aspect of the present invention, preferably said storage node electrode and said second insulating film are formed in contact at least at part of the top surface and the side surface of said second insulating film. Due to this, it becomes possible to bring the storage node electrode and the second insulating film in contact without generating a gap. When the insulating film used as the mold for forming the storage node electrode is removed with a selectivity with respect to the second insulating film, the removal of the first insulating film below the second insulating film can be prevented.

Further, to achieve the object, according to a second aspect of the present invention, there is provided a semiconductor memory device comprising a plurality of memory cells each having a memory capacitor having a storage node electrode and a transistor, comprising a substrate, a transistor formed on said substrate, a first insulating film formed on said substrate covering said transistor, a storage node contact hole formed on said insulating film and reaching the source and drain region of said transistor, a storage node contact plug buried in said storage node contact hole, a storage node electrode formed connected to said storage node contact plug, a second insulating film formed above said first insulating film in the gap of said storage node electrode, a capacitor insulating film formed above said storage node electrode, and a plate electrode formed above said capacitor insulating film, said storage node electrode and said second insulating film being formed in contact at least at part of the top surface and the side surface of said second insulating film.

According to the semiconductor memory device of this aspect of the present invention, since the storage node electrode and the second insulating film are formed in contact at least at part of the top surface and the side surface of the second insulating film, it becomes possible to bring the storage node electrode and the second insulating film into contact without generating a gap. When the insulating film used as a mold for forming the storage node electrode is removed with a selectivity with respect to the second insulating film, the removal of the first insulating film below the second insulating film can be prevented.

In the semiconductor memory device of this aspect of the present invention, preferably the bit line is formed above said transistor via the insulating film and said transistor and said bit line are covered by said first insulating film. As the COB type capacitor (storage node electrode), the largest capacitor (storage node electrode) determined by the miniaturization can be formed on the cell region.

In the semiconductor memory device of this aspect of the present invention, preferably said storage node electrode is a cylinder type. In the cylinder type, the peripheral length of the electrode can be effectively used as the surface area, therefore the storage capacity can be easily secured even while reducing the occupied area thereof.

Further, to attain the above object, according to a third aspect of the present invention, there is provided a method for producing a semiconductor memory device comprising a plurality of memory cells each having a memory capacitor having a storage node electrode and a transistor, including a step of forming a transistor on a substrate, a step of forming a first insulating film covering said transistor, a step of opening a storage node contact hole reaching a source and drain region of said transistor in said first insulating film, a step of forming a storage node contact plug by filling said storage node contact hole by a conductor, a step of forming a second insulating film having a different etching selectivity from that of said first insulating film above said first insulating film, a step of forming a third insulating film having a different etching selectivity from that of said second insulating film above said second insulating film, a step of opening an opening portion acting as the mold for forming the storage node electrode and exposing at least the top surface of said storage node contact plug in said second insulating film and said third insulating film, a step of etching to selectively remove said first insulating film and said third insulating film with respect to said second insulating film to cause the bottom surface and the side wall surface of said opening portion to retract, a step of forming the storage node electrode connected to said storage node contact plug while bringing it in contact with said second insulating film by using said opening portion as a mold, a step of removing said third insulating film by using said second insulating film as an etching stopper, a step of forming a capacitor insulating film above said storage node electrode, and a step of forming a plate electrode above said capacitor insulating film.

That is, in the method for producing a semiconductor memory device of this aspect of the present invention, a transistor is formed on a substrate, the first insulating film is formed covering the transistor, a storage node contact hole reaching the source and drain region of the transistor is opened in the first insulating film, and the storage node contact hole is filled by the conductor to form a storage node contact plug.

Next, a second insulating film having a different etching selectivity from that of the first insulating film is formed above the first insulating film, and a third insulating film having a different etching selectivity from that of the second insulating film is formed above the second insulating film.

Next, in the second insulating film and the third insulating film, an opening portion acting as the mold for forming the storage node electrode and for exposing at least the top surface of the storage node contact plug is opened and the bottom surface and the side wall surface of the opening portion are caused to retract by etching for selectively removing the first insulating film and the third insulating film with respect to the second insulating film.

Next, a storage node electrode is formed connected to the storage node contact plug while bringing it in contact with the second insulating film by using the opening portion as a mold, a third insulating film is removed by using the second insulating film as an etching stopper, a capacitor insulating film is formed above the storage node electrode, and a plate electrode is formed above the capacitor insulating film.

According to the method for producing a semiconductor memory device of this aspect of the present invention, an opening portion acting as the mold for forming the storage node electrode is opened in the second insulating film and the third insulating film, then the bottom surface and the side wall surface of the opening portion are made to retract, whereby it becomes possible to cause said bottom surface to retract so that the storage node contact plug projects out inside the opening portion and the storage node electrode and the storage node contact plug can be connected at least at part of the top surface and the side surface of the storage node contact plug. By this, it becomes possible to reliably connect the storage node electrode and the storage node contact plug.

Further, it becomes possible to cause the side wall surface to retract so that said second insulating film projects out into the opening portion at the side wall surface and possible to bring the storage node electrode and the second insulating film into contact without a gap and, when removing the third insulating film using the second insulating film as an etching stopper, to prevent the removal of the first insulating film below the second insulating film.

In the method for producing a semiconductor memory device of this aspect of the present invention, preferably, in the step of causing the bottom surface and the side wall surface of said opening portion to retract, said first insulating film and said third insulating film are selectively removed with respect to the second insulating film by isotropic etching. According to the isotropic etching, the bottom surface and the side wall surface of the opening portion can be made to retract.

In the method for producing a semiconductor memory device of this aspect of the present invention, preferably, in the step of forming said storage node contact plug, said storage node contact plug is formed so that the height of the top surface of said storage node contact plug matches the height of the surface of said first insulating film. Alternatively, preferably, the step of forming said storage node contact plug includes a step of forming a conductor on the entire surface while filling said storage node contact hole and a step of removing said conductor formed on the outside of said storage node contact hole by polishing. By this, a storage node contact plug can be formed while suppressing the plug loss.

In the method for producing a semiconductor memory device of this aspect of the present invention, preferably the step of forming said storage node electrode includes a step of forming a storage node electrode use layer connected to said storage node contact plug while bringing it in contact with said second insulating film by using said opening portion as a mold, a step of forming a fourth insulating film above said storage node electrode use layer, and a step of dividing said storage node electrode use layer into individual storage node electrodes by polishing from the top surface of said fourth insulating film, and in the step of removing said third insulating film by using said second insulating film as an etching stopper, said fourth insulating film is simultaneously removed. It is possible to use the third insulating film and the fourth insulating film as layers for forming the storage node electrode and processing the same.

In the method for producing a semiconductor memory device of this aspect of the present invention, preferably said first insulating film and said third insulating film are formed by silicon oxide and said second insulating film is formed by silicon nitride. Due to this, the bottom surface and the side wall surface of the opening portion acting as the mold of the storage node electrode can be caused to retract by removing the first insulating film and the third insulating film by etching with selectivity with respect to the second insulating film. Further, the third insulating film can be removed by using the second insulating film as an etching stopper.

BRIEF DESCRIPTION OF THE DRAWINGS

The above object and features of the present invention will become more apparent from the following description of the preferred embodiments given with reference to the accompanying drawings, wherein:

FIGS. 2A and 2X are sectional views of steps in the method for producing a semiconductor memory device according to an embodiment of the present invention, in which:

FIG. 2A shows the state up to the step of forming an element isolation insulating film;

FIG. 2X shows the state up to the step of forming the capacitor insulating film;

FIGS. 5A to 5L are sectional views of steps in the method for producing a semiconductor memory device according to the related art, in which:

FIG. 5A shows the state up to the step of forming a fifth inter-layer insulating film;

FIG. 5B shows the state up to the step of forming a mask layer;

FIG. 5C shows the state up to the step of forming a layer for a side wall mask;

FIG. 5D shows the state up to the step of forming the side wall mask layer;

FIG. 5E shows up to the step of opening a second storage node contact hole;

FIG. 5F shows the state up to the step of forming a layer for a second storage node contact plug;

FIG. 5G shows the state up to the step of forming the second storage node contact plug;

FIG. 5H shows the state up to the step of forming a layer for forming a first storage node;

FIG. 5I shows the state up to the step of forming an opening portion acting as the mold of the storage node electrode;

FIG. 5J shows the state up to the step of forming a layer for forming a second storage node;

FIG. 5K shows the state up to the step of removing a layer for forming first and second storage nodes; and FIG. 5L shows the state up to the step of forming a capacitor insulating film;

FIG. 7A is a sectional view for explaining the problem in the related art where the pattern of formation of storage node electrodes is off and FIG. 7B is an enlarged view of the region X in FIG. 7A.

DESCRIPTION OF THE PREFERRED EMBODIMENTS

Before describing the embodiments of the present invention, the related art and the disadvantages therein will be described with reference to the related figures.

First, an explanation will be made of a semiconductor memory device having a cylinder type storage node electrode according to the method of the related art and a method for producing the same by referring to FIGS. 4A to 4B to FIGS. 5A to 5L.

Figure 4A:
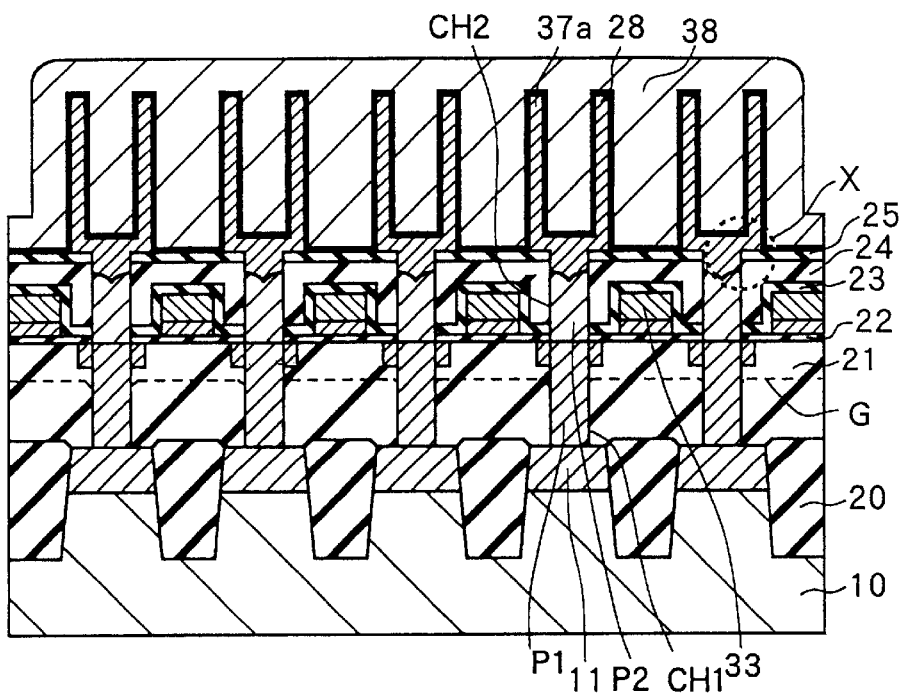
FIGS. 4A is a sectional view of a semiconductor memory device according to the related art and FIG. 4B is an enlarged view of the region X in FIG. 4A.
Figure 4B:
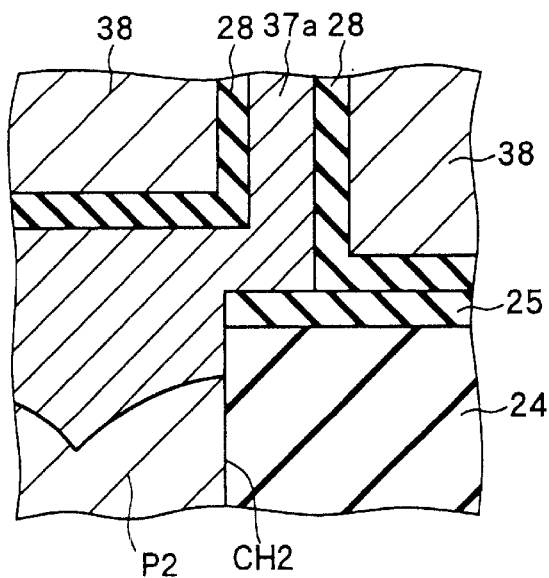

FIG. 4A is a sectional view of a semiconductor memory device having a cylinder type storage node electrode according to the related art, and FIG. 4B is an enlarged view of a region X in FIG. 4A.

On an active region isolated by a trench type element isolation insulating film 20 on a silicon semiconductor substrate 10, a transistor comprising a not illustrated gate insulating film, a gate electrode G and a source and drain diffusion layer 11 or the like is formed. A first inter-layer insulating film 21 made of for example silicon oxide is formed above this.

A first storage node contact hole CH1 reaching the source and drain diffusion layer 11 is opened in the first inter-layer insulating film 21 and buried to form a first storage node contact plug P1. Further, a not illustrated bit contact hole reaching the source and drain diffusion layer 11 is opened in the first inter-layer insulating film 21 and buried to form a bit contact plug. Above the first inter-layer insulating film 21, a second inter-layer insulating film 22 made of for example silicon oxide is formed. A bit line 33 having for example a polycide structure is formed above this and connected to the bit contact plug.

A third inter-layer insulating film 23 made of for example silicon nitride is formed covering the bit line 33, a fourth inter-layer insulating film 24 made of for example silicon oxide is formed above this, and a fifth inter-layer insulating film 25 made of for example silicon nitride is formed above this. A second storage node contact hole CH2 for exposing the top surface of the first storage node contact plug P1 is opened penetrating through the third to fifth inter-layer insulating films (23, 24, 25) and buried to form a second storage node contact plug P2 connected to the first storage node contact plug P1.

Above the second storage node contact plug P2, a storage node electrode 37a made of a polycrystalline silicon containing for example a conductive impurity is formed so as to be connected to the second storage node contact plug P2. A capacitor insulating film 28 made of for example an NO film (stacked insulating film of a nitride film and an oxide film) is formed covering the surface of the storage node electrode 37a. A plate electrode 38 made of polycrystalline silicon containing for example a conductive impurity is formed above this. Thus, a memory capacitor comprising the storage node electrode 37a, capacitor insulating film 28, and the plate electrode 38 is formed.

Next, an explanation will be made of the method for producing the semiconductor memory device shown in FIGS. 4A and 4B. First, an explanation will be made of the steps up to FIG. 5A. An element isolation insulating film 20 is formed on a semiconductor substrate 10 by for example a shallow trench isolation (STI) process, then a not illustrated gate insulating film, gate electrode G, and source and drain diffusion layer 11 are formed in the active region to form the transistor.

Next, silicon oxide is deposited by for example a chemical vapor deposition (CVD) process, a first inter-layer insulating film 21 is formed, and a bit contact hole (not illustrated) and first storage node contact hole CH1 for exposing the source and drain diffusion layer 11 are opened in the first inter-layer insulating film 21.

Next, the bit contact hole and the first storage node contact hole CH1 are buried by polycrystalline silicon containing a conductive impurity or the like by for example a CVD process to form the bit contact plug (not illustrated) and the first storage node contact plug P1.

Next, silicon oxide is deposited by for example the CVD process to form a second inter-layer insulating film 22, and a bit line 33 having for example a polycide structure is formed above this so as to be connected to the bit contact plug described above.

Next, silicon nitride is deposited over the whole surface covering the bit line 33 by for example the CVD process to form the third inter-layer insulating film 23.

Next, silicon oxide is deposited by for example the CVD process to form the fourth inter-layer insulating film 24.

Next, silicon oxide is deposited by for example the CVD process to form the fifth inter-layer insulating film 25.

Figure 5A:
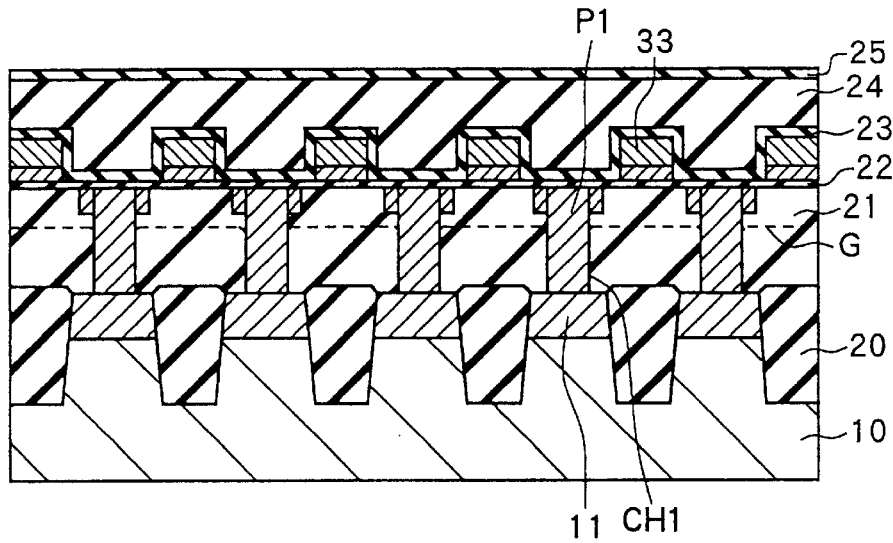
Figure 5B:
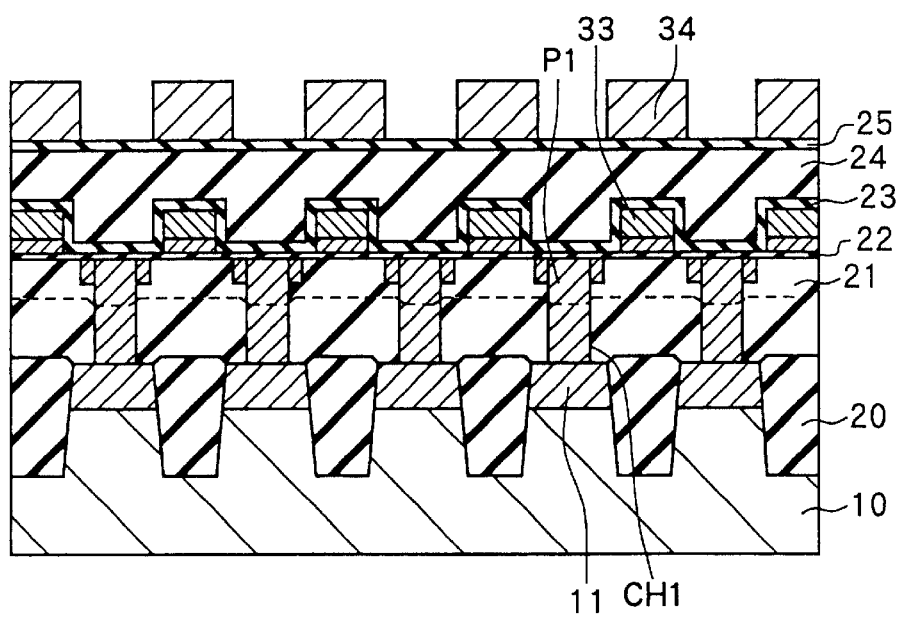

Next, as shown in FIG. 5B, polycrystalline silicon is deposited above the fifth inter-layer insulating film by for example the CVD process and processed to the pattern of opening the second storage node contact holes to form a mask layer 34.

Figure 5C:
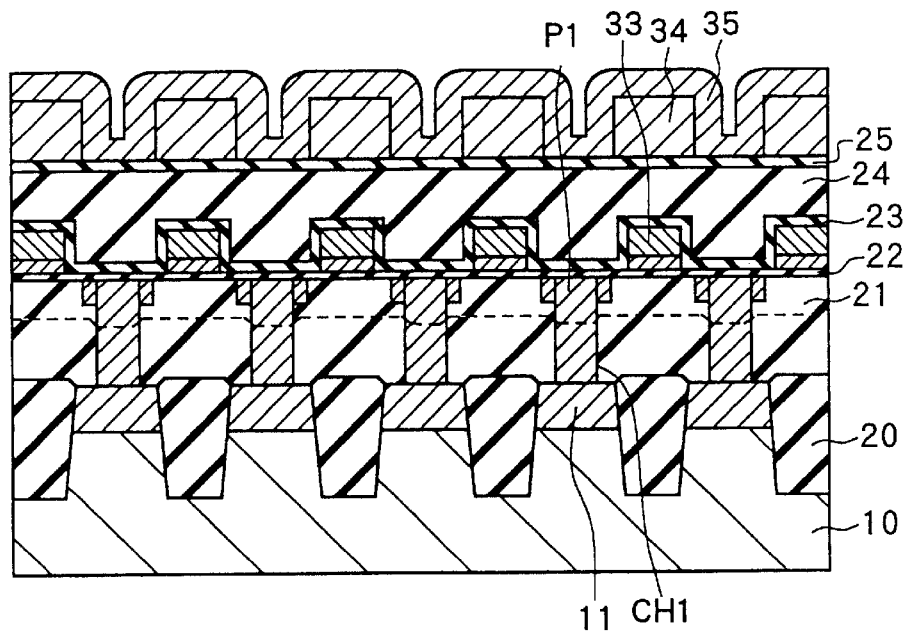

Next, as shown in FIG. 5C, the polycrystalline silicon is deposited above the mask layer 34 by for example the CVD process to form a side wall mask use layer 35.

Figure 5D:
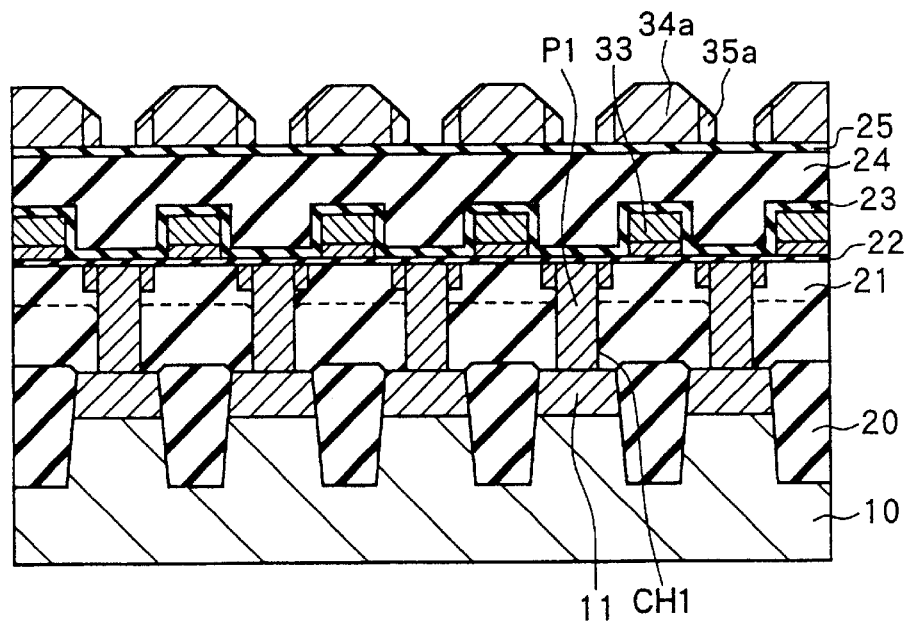

Next, as shown in FIG. 5D, for example reactive ion etching (RIE) or other etching is applied to remove the side wall mask use layer 35 while leaving the part covering the side wall portion of the mask layer 34 to thereby form a side wall mask layer 35a. At this time, a mask layer 34a is formed with rounded shoulder portions.

Figure 5E:
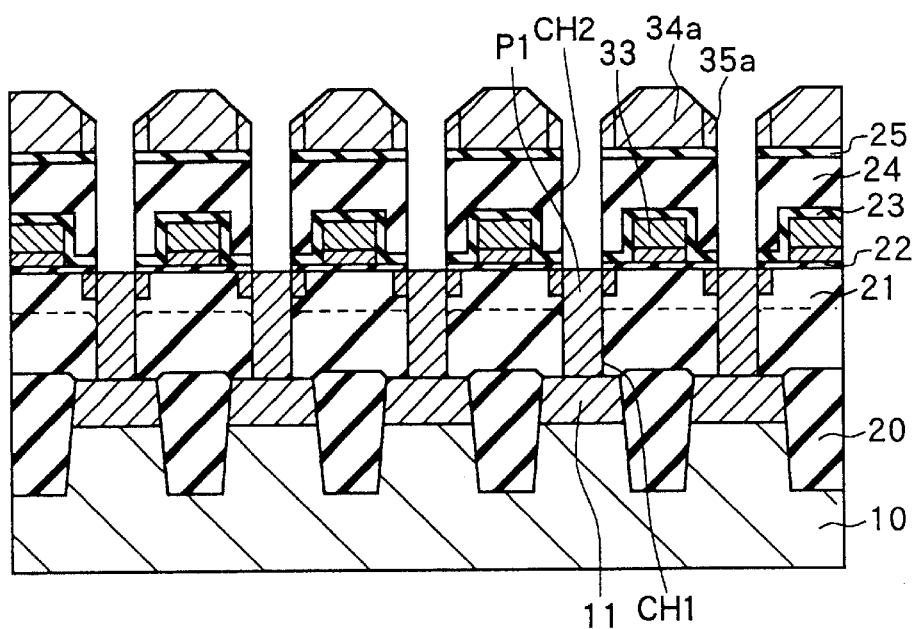

Next, as shown in FIG. 5E, RIE or other etching is applied by using the mask layer 34a and the side wall mask layer 35a as masks to penetrate through the second inter-layer insulating film 22, third inter-layer insulating film 23, fourth inter-layer insulating film 24, and fifth inter-layer insulating film 25 and open the second storage node contact hole CH2 for exposing the top surface of the first storage node contact plug P1.

Figure 5F:
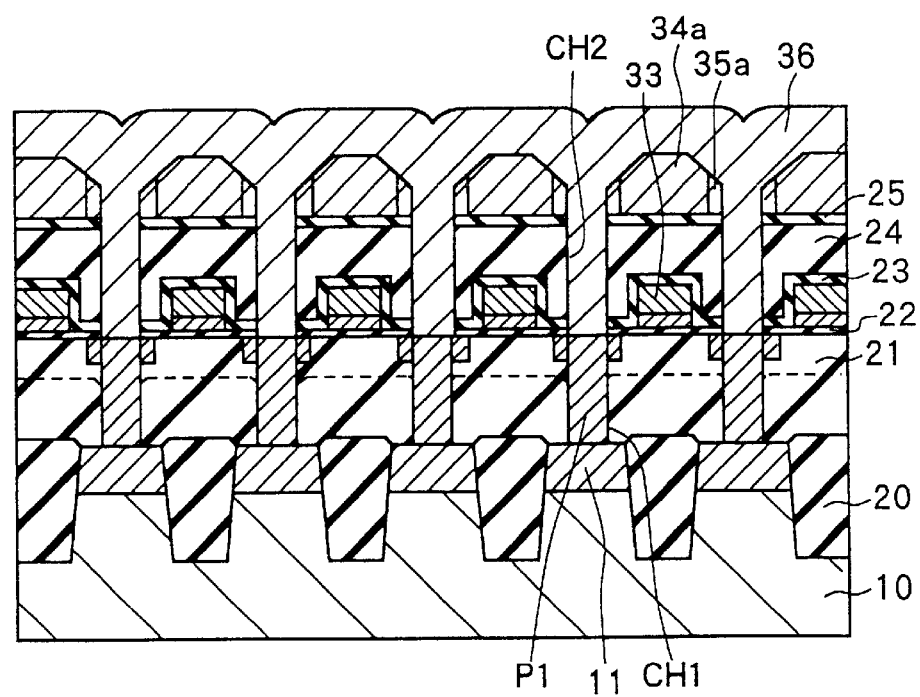

Next, as shown in FIG. 5F, polycrystalline silicon or the like containing a conductive impurity is deposited by for example the CVD process over the entire surface burying the second storage node contact hole CH2 so as to be connected to the first storage node contact plug P1 to form a second storage node contact plug use layer 36.

Figure 5G:
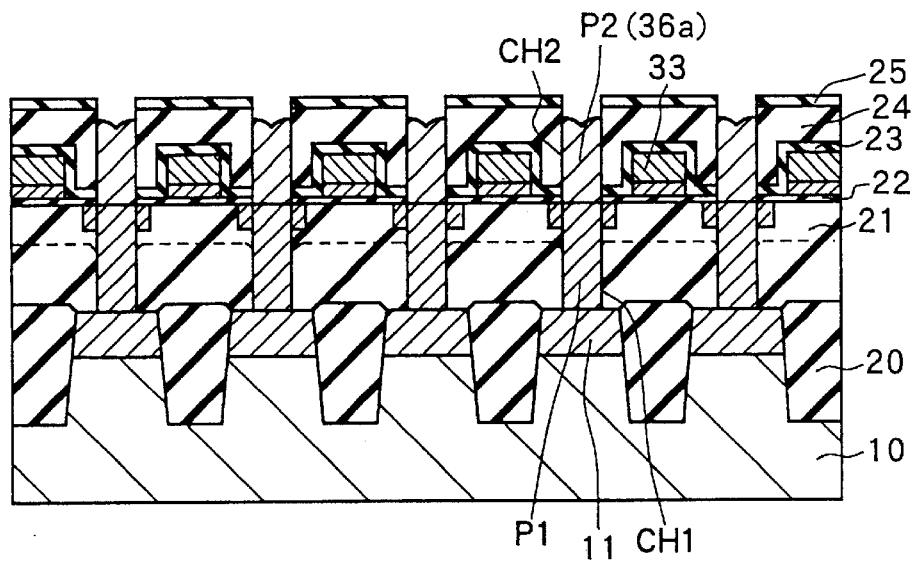

Next, as shown in FIG. 5G, this is etched back by for example RIE or other etching to remove the polycrystalline silicon deposited on the outside of the second storage node contact hole CH2 while leaving the inside of the second storage node contact hole CH2 to form the second storage node contact storage node contact plug P2 (36a).

Figure 5H:
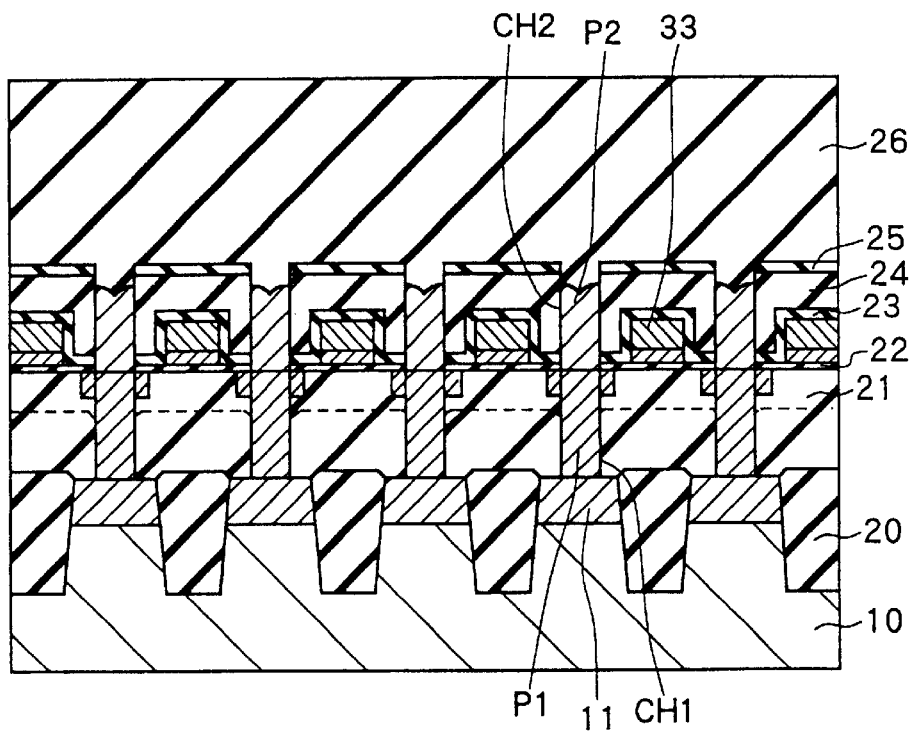

Next, as shown in FIG. 5H, silicon oxide is deposited over the entire surface of the second storage node contact plug P2 and the fifth inter-layer insulating film 25 by for example the CVD process to form a first storage node forming layer 26.

Figure 5I:
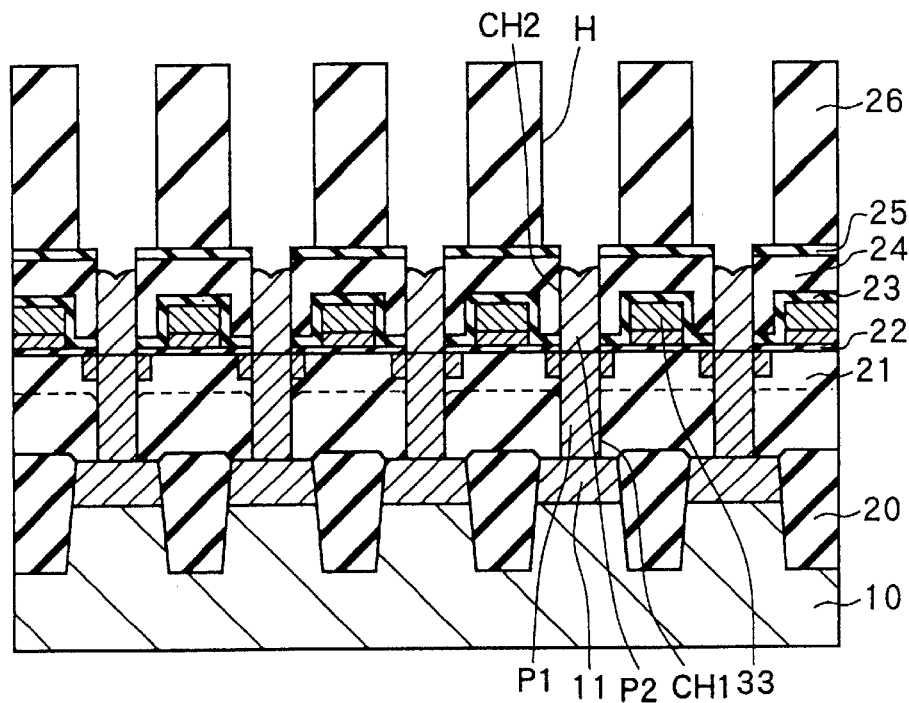

Next, as shown in FIG. 5I, a resist film is formed by patterning above the first storage node forming layer 26 by photolithography and is etched by RIE etc. to form an opening portion H acting as a mold of the storage node electrode.

Figure 5J:
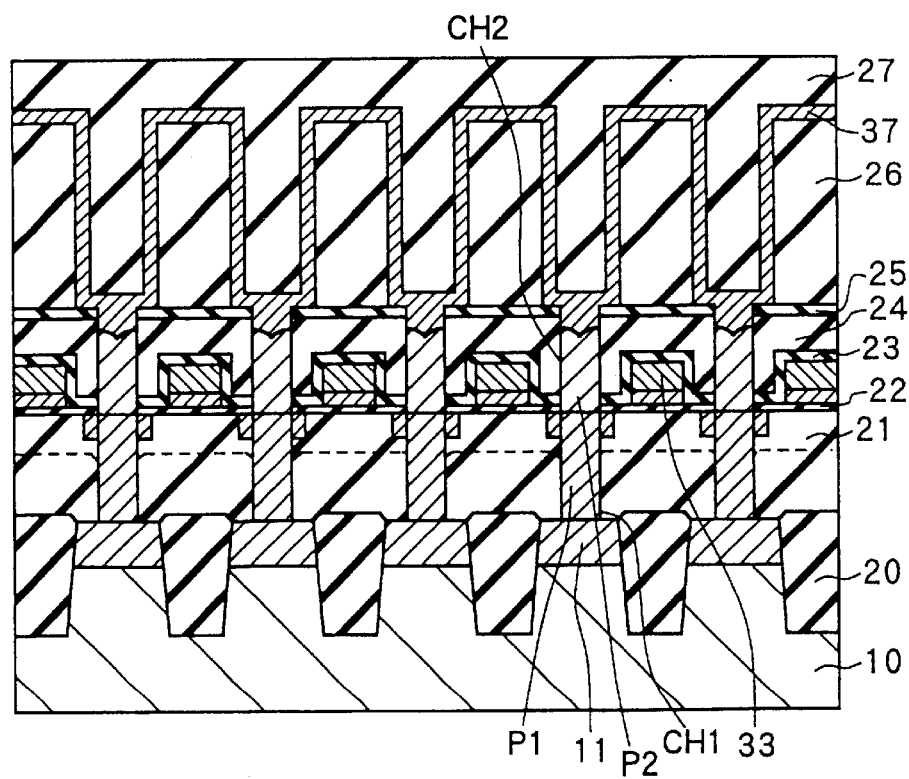

Next, as shown in FIG. 5J, polycrystalline silicon or an amorphous silicon containing phosphorus or another conductive impurity is deposited over the entire surface covering the side wall of the opening portion H acting as the mold of the storage node electrode by for example the CVD process to form a storage node electrode use layer 37 connected to the second storage node contact plug P2.

Next, silicon oxide is deposited above the storage node electrode use layer 37 while burying the opening portion H acting as the mold of the storage node electrode by for example the CVD process to form a second storage node forming layer 27.

Figure 5K:
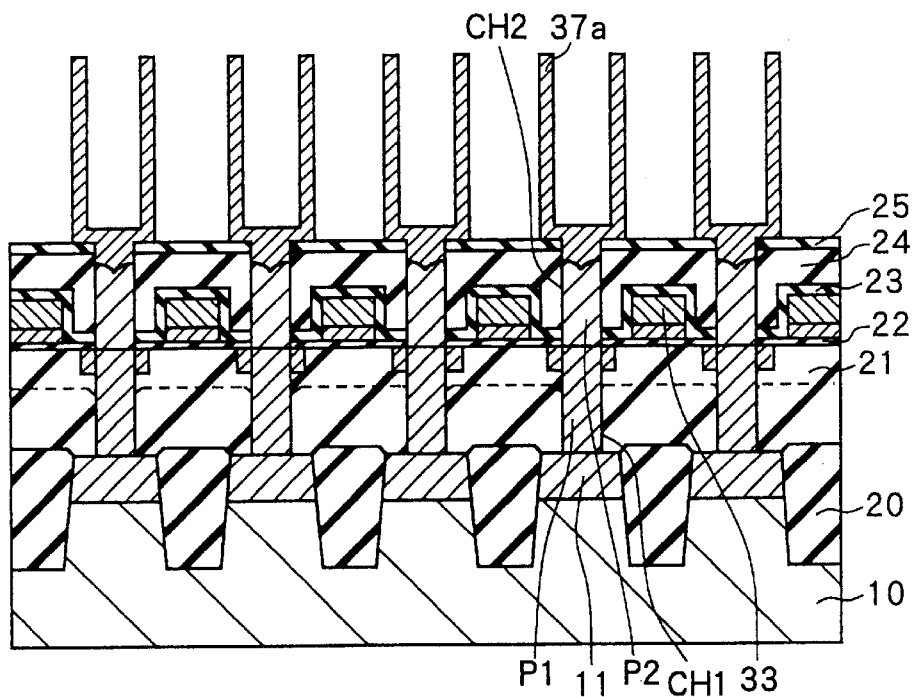

Next, as shown in FIG. 5K, for example, the second storage node forming layer 27 and the storage node electrode use layer 37 are sequentially etched back from above or polished from above by a chemical mechanical polishing (CMP) process to form the individually divided storage node electrode 37a and the second storage node forming layer.

Next, for example fluoric acid-based wet etching is performed to remove the first storage node forming layer 26 and the second storage node forming layer 27. At this time, the fifth inter-layer insulating film 25 made of for example silicon nitride acts as the etching stopper.

Figure 5L:
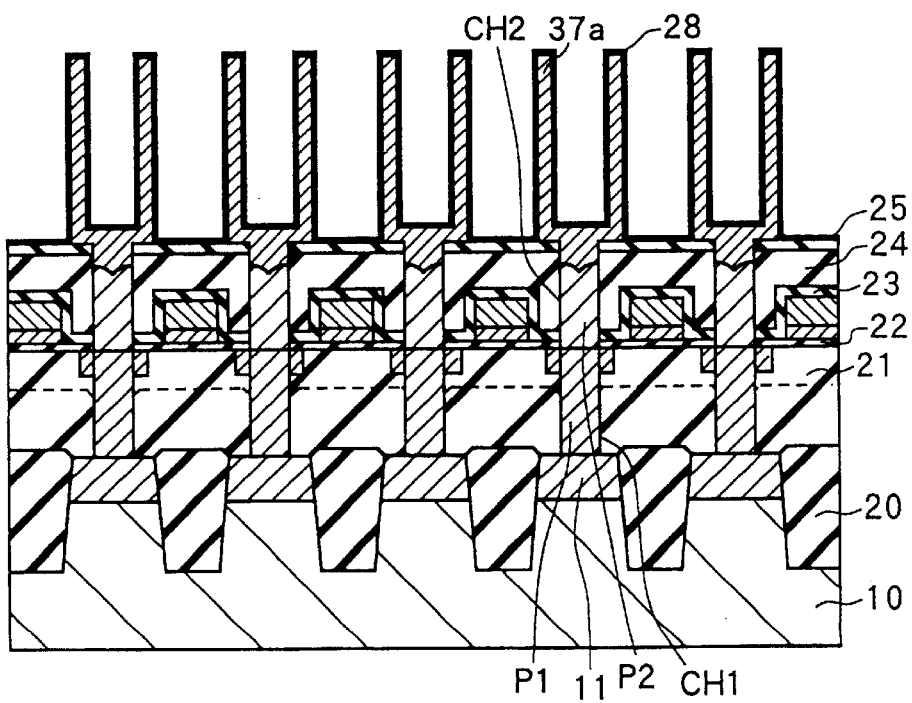

Next, as shown in FIG. 5L, after the natural oxide film on the surface of for example the storage node electrode 37a is removed by the fluoric acid-based wet etching, a silicon nitride layer is formed by a rapid thermal nitridation (RTN) process and a low pressure CVD process. Further, a silicon oxide layer is formed on the surface of the silicon nitride layer by thermal oxidation treatment to form a capacitor insulating film 28 made of an NO film (stacked insulating film of a nitride film and oxide film) covering the storage node electrode 37a.

Next, polycrystalline silicon containing a conductive impurity is deposited by for example the CVD process to form the plate electrode 38 and thus complete the capacitor having the structure shown in FIGS. 4a and 4b. As the following steps, the upper insulating film is formed on the entire surface covering the capacitor etc., the upper interconnections are formed according to need, and so on to produce the desired semiconductor memory device.

Figure 6:
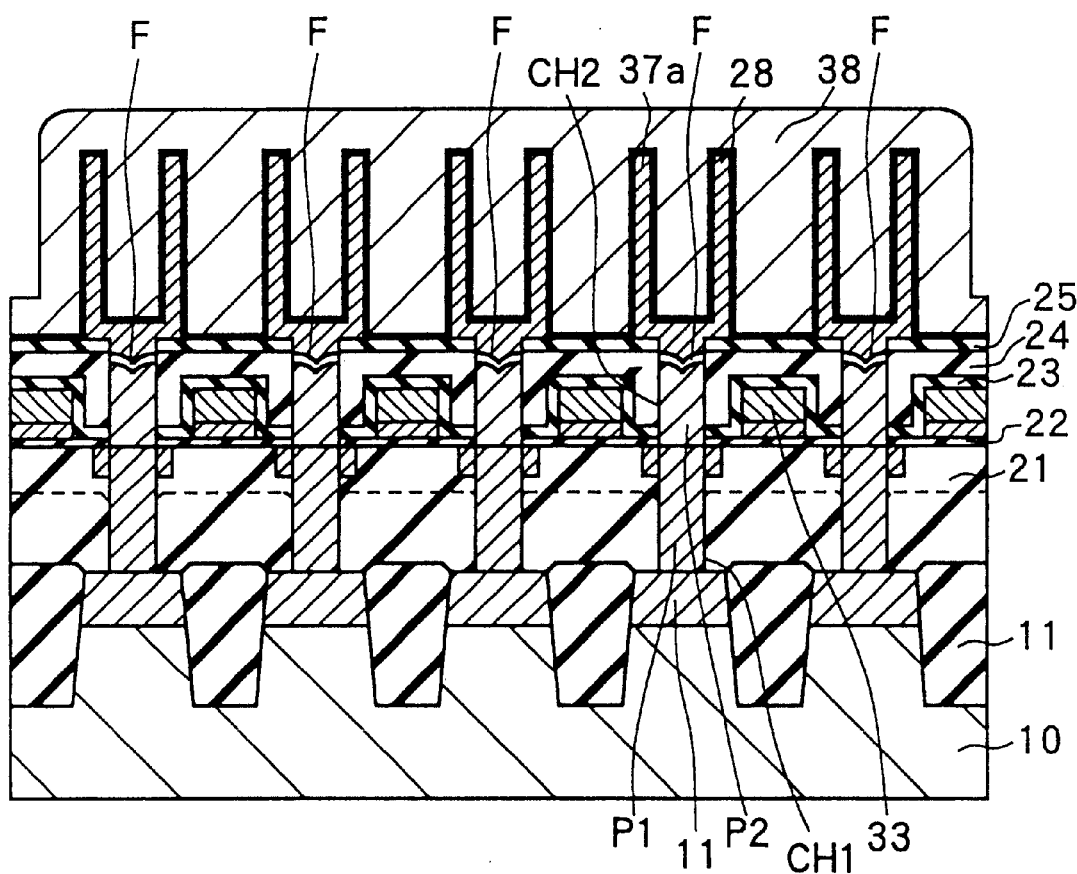
FIG. 6 is a sectional view for explaining the problem of the related art.

Summarizing the problem to be solved by the invention, in the above method of the related art, however, in the step of forming the (second) storage node contact plug, plug loss sometimes becomes large when etching back by RIE or other etching. Where the plug loss is large, it becomes difficult to expose the top surface of the storage node contact plug in the patterning step of the storage node forming layer. As shown in FIG. 6, a connection failure F occurs between the storage node contact plug P2 and the storage node electrode 37a.

Further, even in a case where the connection failure F is not caused, the following problem sometimes occurs. FIG. 7A is a sectional view showing the state up to the step of forming the storage node electrode use layer 37 in the method for producing the semiconductor memory device, and FIG. 7B is an enlarged view in the region X of FIG. 7A. Here, a case where the opening portion H is formed deviated to the left in the figure by the amount of distance A to an extent that one end of the opening portion H acting as the mold of the storage node electrode formed in the first storage node forming layer 26 is located above the storage node contact plug P2 is shown.

Figure 8A:
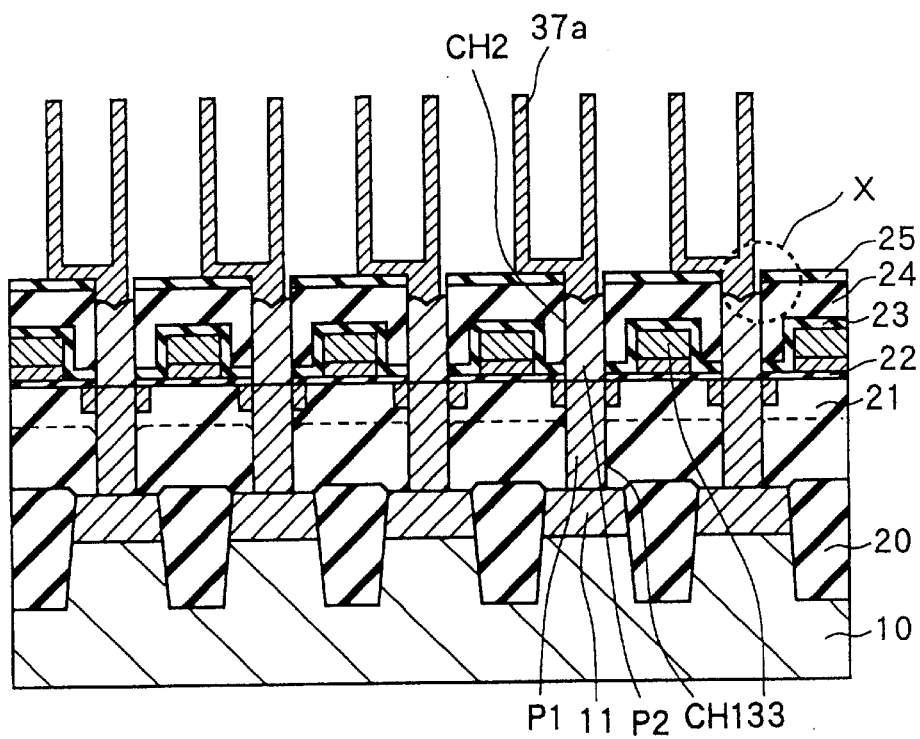
FIG. 8A is another sectional view for explaining the problem in the related art where the pattern of formation of storage node electrodes is off and FIG. 8B is an enlarged view of the region X in FIG. 8A.
Figure 8B:
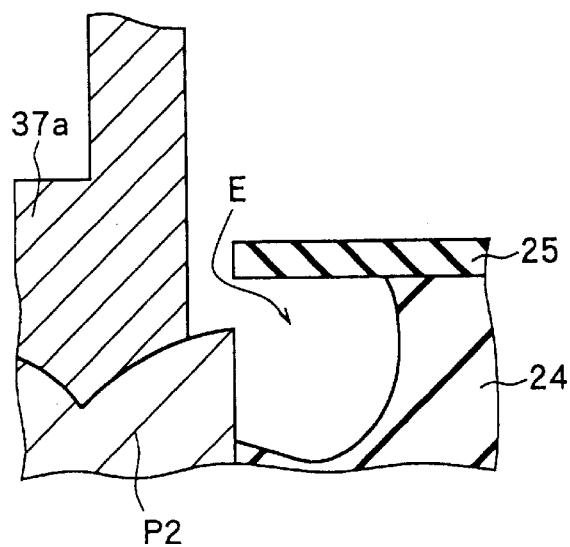

As described above, where one end of the opening portion H is located above the storage node contact plug P2, as shown in FIG. 8A and FIG. 8B which is an enlarged view of the region X in the same figure, when for example fluoric acid-based wet etching is applied to form the first storage node forming layer 26, the etchant E permeates from a gap between the storage node contact plug P2 and the fifth inter-layer insulating film 25 (etching stopper), the fourth inter-layer insulating film 24 below the fifth inter-layer insulating film 25 etc. are removed by etching, and, in the worst case, short-circuiting of the bit line and the storage node occurs.

In order to avoid the problem, the method of making the fifth inter-layer insulating film (etching stopper) thicker to prevent the top surface of the storage node contact plug from becoming lower than the bottom surface of the fifth inter-layer insulating film can be considered, but in this case, there were the disadvantages that the entire inter-layer insulating film became thicker and the opening for exposing the storage node contact plug was liable to become insufficient, so connection failure was liable to occur between the storage node contact plug and the storage node electrode.

Below, an explanation will be made of the method for producing a semiconductor memory device according to an embodiment of the present invention by referring to the drawings.

Figure 1A:
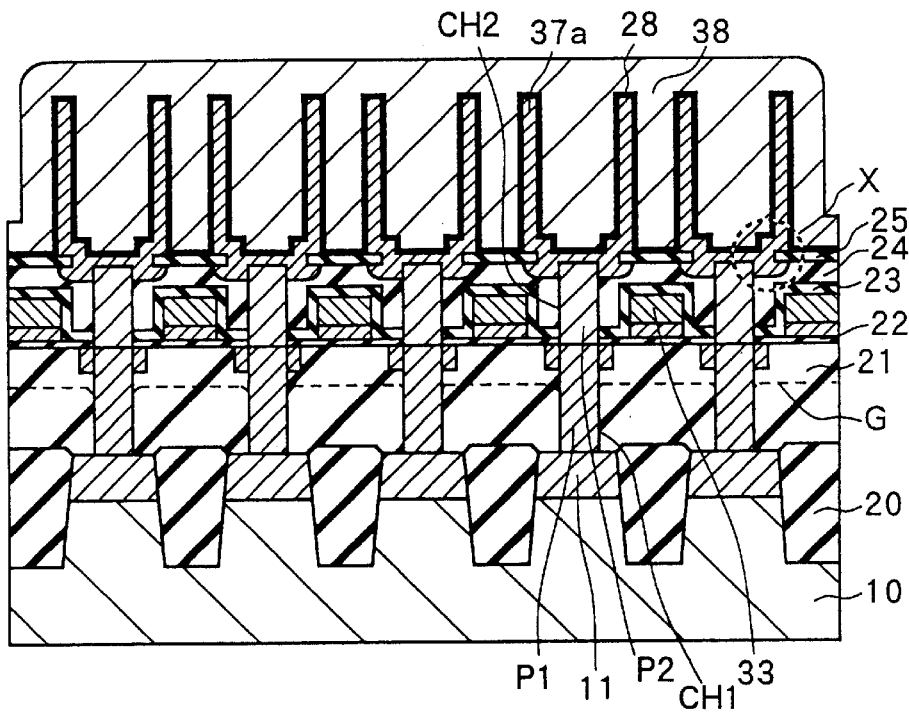
FIG. 1A is a sectional view of a semiconductor memory device according to an embodiment of the present invention and FIG. 1B is an enlarged view of a region X in FIG. 1A.
Figure 1B:
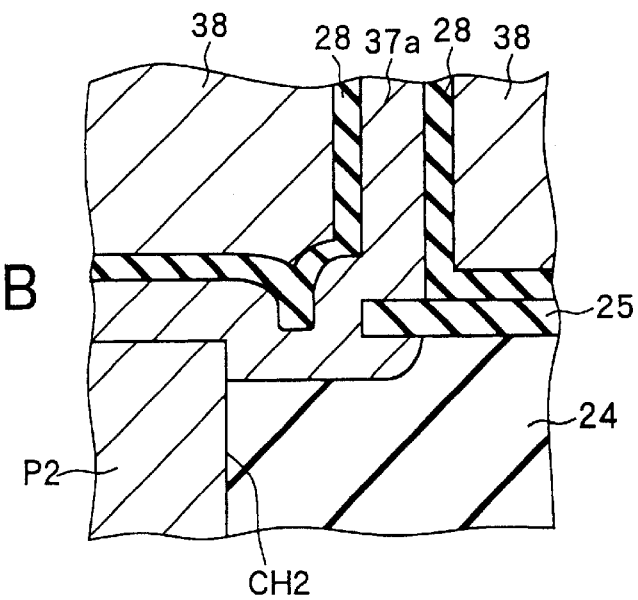

The semiconductor memory device according to the present embodiment is a COB type DRAM having a cylinder type storage node electrode. FIG. 1A is a sectional view thereof, and FIG. 1B is an enlarged view of the region X in FIG. 1A.

One memory cell is constituted by one transistor and one memory capacitor. m×n (five in a horizontal direction in the figure) number of these memory cells are arranged in the form of a matrix.

On the active region isolated by a trench type element isolation insulating film 20 on the silicon semiconductor substrate 10, a transistor comprising a not illustrated gate insulating film, a gate electrode G having a polycide structure comprising a stack of for example polycrystalline silicon and tungsten silicide, a source and drain diffusion layer 11 having for example a lightly doped drain (LDD) structure, etc. is formed. A first inter-layer insulating film 21 made of for example silicon oxide is formed above this.

A first storage node contact hole CH1 reaching the source and drain diffusion layer 11 is opened in the first inter-layer insulating film 21 and buried to form the first storage node contact plug P1. Further, a not illustrated bit contact hole reaching the source and drain diffusion layer 11 is opened in the first inter-layer insulating film 21 and buried to form the bit contact plug. Above the first inter-layer insulating film 21, a second inter-layer insulating film 22 made of for example silicon oxide is formed. A bit line 33 having a polycide structure comprising a stack of for example polycrystalline silicon and tungsten sulicide is formed above this and connected to the bit contact plug.

A third inter-layer insulating film 23 made of for example silicon nitride is formed covering the bit line 33, a fourth inter-layer insulating film 24 made of for example silicon oxide is formed above this, and a fifth inter-layer insulating film 25 made of for example silicon nitride is formed above this. The second storage node contact hole CH2 for exposing the top surface of the first storage node contact plug P1 is opened penetrating through the third to fifth inter-layer insulating films (23, 24, 25) and buried to form the second storage node contact plug P2 connected to the first storage node contact plug P1.

Above the second storage node contact plug P2, a storage node electrode 37a made of for example polycrystalline silicon containing a conductive impurity is formed connected to the second storage node contact plug P2. Here, part of the top surface and the side surface of the second storage node contact plug P2 is formed so as to be connected to the storage node electrode 37a. Further, the storage node electrode 37a and the fifth inter-layer insulating film 25 are formed in contact at part of the top surface and the side surface of the fifth inter-layer insulating film 25.

The capacitor insulating film 28 made of for example the NO film (stacked insulating film of nitride film and oxide film) is formed covering the surface of the storage node electrode 37a and a plate electrode 38 made of for example polycrystalline silicon containing a conductive impurity is formed above this to form a memory capacitor comprising the storage node electrode 37a, the capacitor insulating film 28, and the plate electrode 38.

In the semiconductor memory device of the present embodiment, it becomes possible to reliably connect the storage node electrode and the storage node contact plug by connecting them at part of the top surface and the side surface of the storage node contact plug. Further, the storage node electrode and the fifth inter-layer insulating film are formed in contact at part of the top surface and the side surface of the fifth inter-layer insulating film. Due to this, when the insulating film used as the mold for forming the storage node electrode is removed with selectivity with respect to the fifth inter-layer insulating film, the removal of the fourth inter-layer insulating film below the fifth inter-layer insulating film can be prevented. In this way, there is provided a semiconductor memory device having a high quality storage node electrode and storage node contact plug enabling the prevention of connection failure between the storage node contact plug and the storage node electrode, the prevention of the removal of the insulating film below the etching stopper, which can become a cause of short circuiting, etc.

Figure 2A:
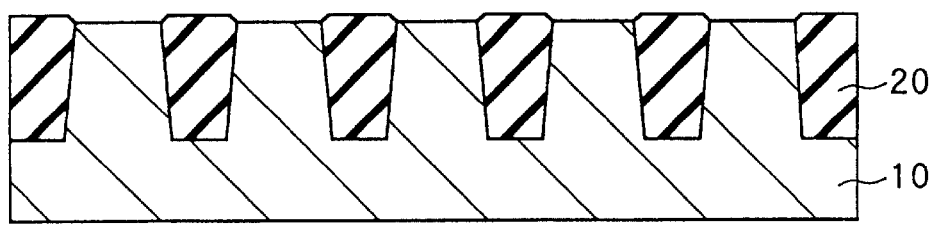

Next, an explanation will be made of the method for producing the semiconductor memory device shown in the above FIGS. 1A and 1B. First, as shown in FIG. 2A, an element isolation insulating film 20 is formed on a silicon semiconductor substrate 10 by for example the STI process.

Figure 2B:
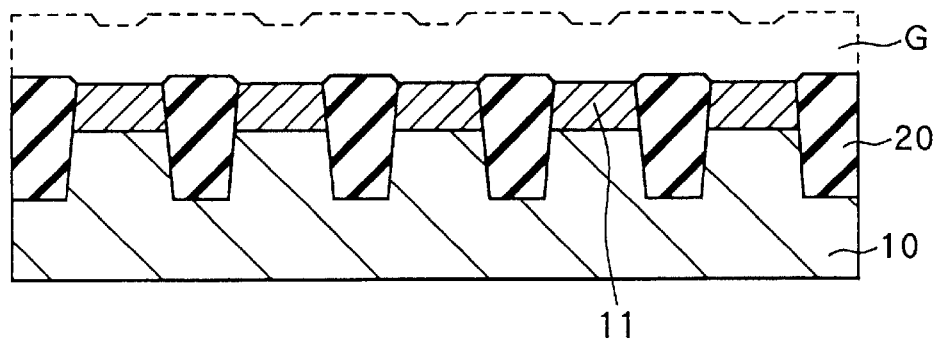
FIG. 2B shows the state up to the step of forming a transistor.

Next, as shown in FIG. 2B, a not illustrated well is formed by introducing a conductive impurity by ion implantation or the like, then a not illustrated gate insulating film, a gate electrode G having a polycide structure comprising a stack of for example polycrystalline silicon and tungsten silicide, and a source and drain diffusion layer 11 having an LDD structure are formed on an active region isolated by the element isolation insulating film 20 by for example a thermal oxidation process to form a transistor. The gate electrode G functions as a word line in the DRAM. It is shown wired in the horizontal direction in the figure and wired at a position different from that on the cross-section shown in FIG. 2B.

Figure 2C:
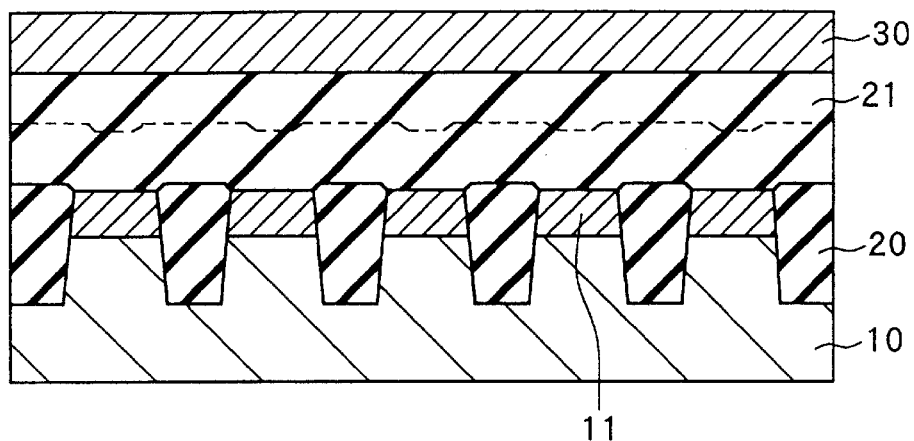
FIG. 2C shows the state up to the step of forming a first mask layer.

Next, as shown in FIG. 2C, silicon oxide is deposited by for example the CVD process to form a first inter-layer insulating film 21.

Next, a silicon layer such as polycrystalline silicon or amorphous silicon is deposited by for example the CVD process to form a first mask layer 30. The first mask layer 30 may or may not contain a conductive impurity.

Figure 2D:
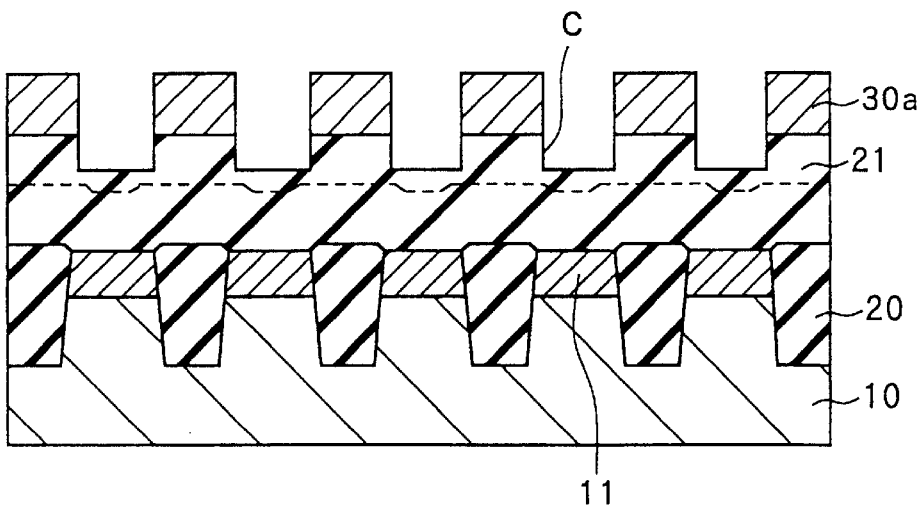
FIG. 2D shows the state up to the step of forming a concavity for a storage node contact hole.

Next, as shown in FIG. 2D, a not illustrated resist film having a pattern of storage node contact holes is formed above the first mask layer 30, RIE or other etching is applied to this to penetrate through the first mask layer 30a and open a concavity C for a storage node contact hole having a depth up to the middle of the first inter-layer insulating film 21. For example, the first mask layer 30 is etched under conditions of an etching gas flow rate of $Cl_2$=75 sccm, a pressure of 400 mPa, a current of 250 mA, and an RF power of −70 W, while the first inter-layer insulating film 21 is etched under conditions of an etching gas flow rate of $C_4F_8$/CO/Ar=10/300/400 sccm, a pressure of 5.3 Pa, and an RF power of 1700 W. Thereafter, the resist film is removed.

Figure 2E:
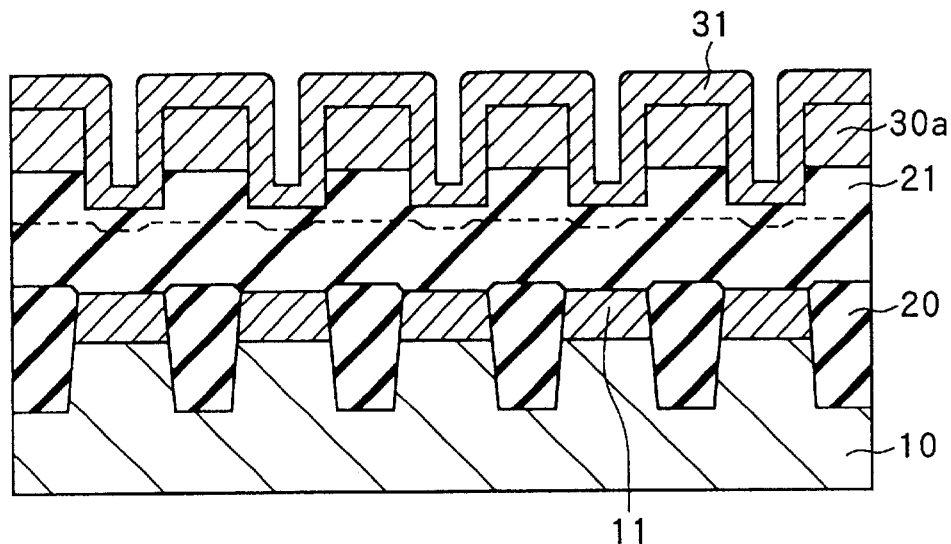
FIG. 2E shows the state up to the step of forming a layer for a first side wall mask.

Next, as shown in FIG. 2E, a silicon layer such as polycrystalline silicon or amorphous silicon is deposited covering the interior of the concavity C for the storage node contact hole by for example the CVD process to thereby form a first side wall mask use layer 31. The first side wall mask use layer 31 may or may not contain a conductive impurity.

Figure 2F:
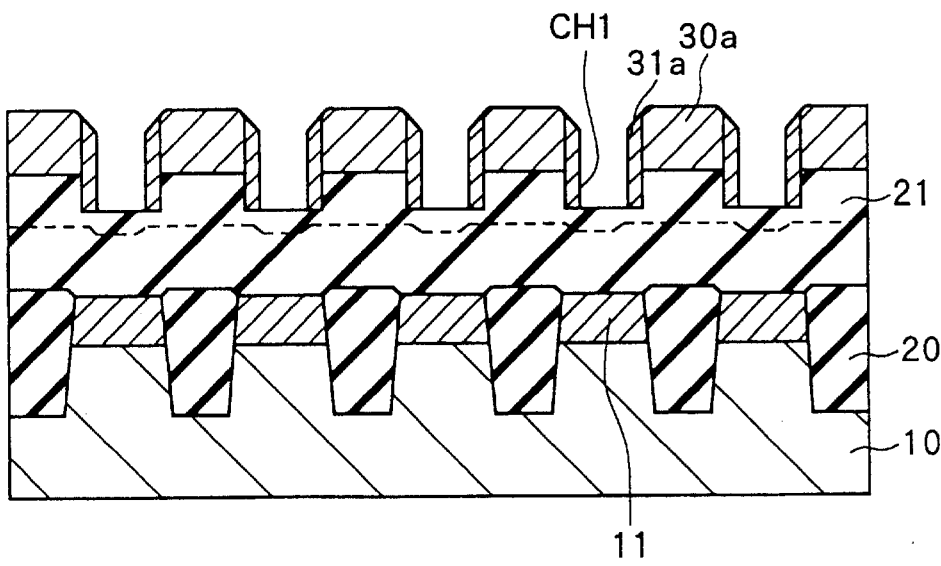
FIG. 2F shows the state up to the step of forming a first side wall mask layer.

Next, as shown in FIG. 2F, for example RIE or other etching is applied to remove the first side wall mask use layer 31 while leaving the part covering a side wall portion of the first mask layer 30a so as to form a first side wall mask layer 31a. At this time, the first mask layer 30a is shaped round at its shoulder portions. The inside of the first side wall mask layer 31a acts as the first storage node contact hole CH1. By forming the first side wall mask layer 31a in the side wall portion of the first mask layer 30a, it becomes possible to open a minute contact hole.

Figure 2G:
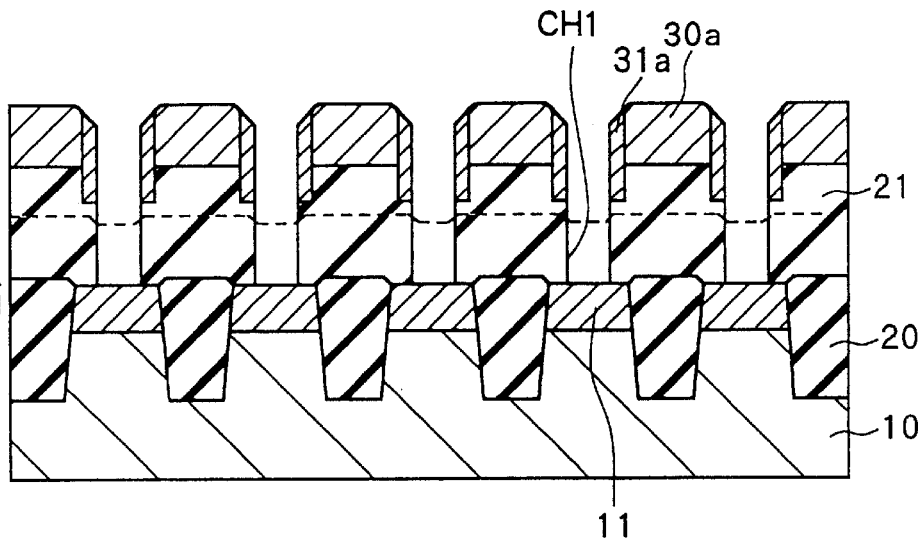
FIG. 2G shows the state up to the step of opening a first storage node contact hole.

Next, as shown in FIG. 2G, RIE or other etching is applied using the first mask layer 30a and the first side wall mask layer 31a as masks to penetrate through the first inter-layer insulating film 21 and open the first storage node contact hole CH1 for exposing the source and drain diffusion layer 11 of the transistor. For example, the first inter-layer insulating film 21 is etched under conditions of an etching gas flow rate of $C_4F_8/CO/Ar/O_2=15/150/300/7$ sccm, a pressure of 4 Pa. and an RF power of 1500 W.

Figure 2H:
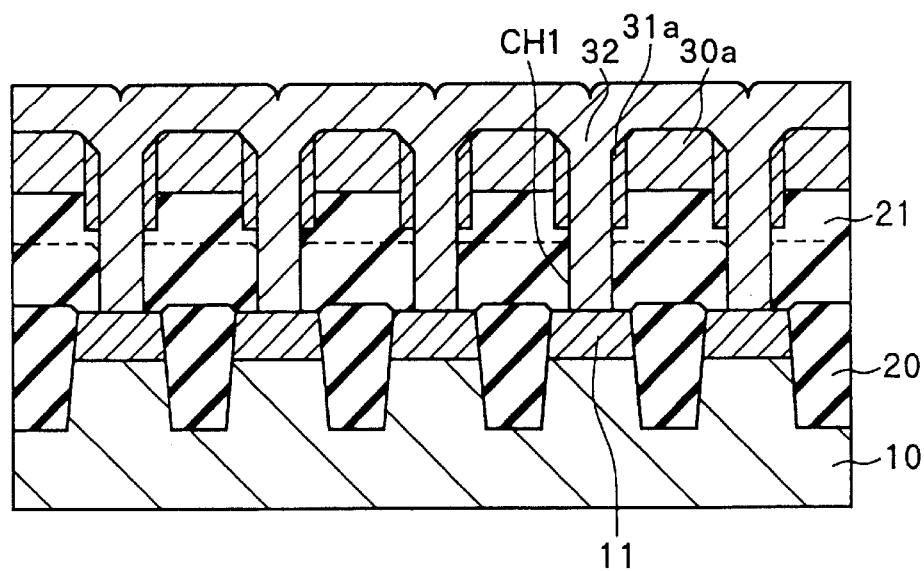
FIG. 2H shows the state up to the step of forming a layer for a first storage node contact plug.

Next, as shown in FIG. 2H, a silicon layer such as polycrystalline silicon or amorphous silicon containing the same conductivity type conductive impurity as that of the source and drain diffusion layer 11 is deposited by for example the CVD process on the entire surface while burying the first storage node contact hole CH1 to connect to the source and drain diffusion layer 11 and thereby to form the first storage node contact plug use layer 32.

Figure 2I:
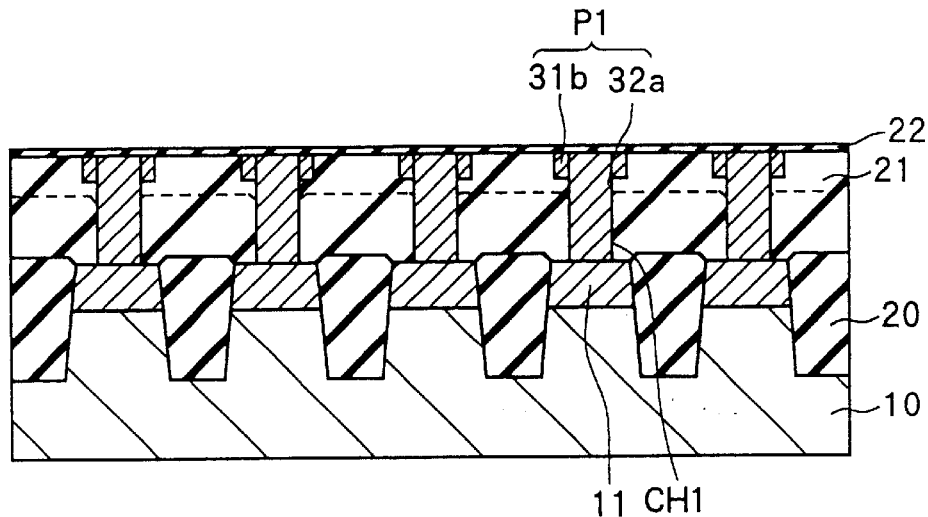
FIG. 2I shows the state up to the step of forming a second inter-layer insulating film.

Next, as shown in FIG. 2I, this is etched back by for example RIE or other etching and polished by a CMP process to remove the polycrystalline silicon (or amorphous silicon) deposited on the outside of the first storage node contact hole CH1 and leave the inside of the first storage node contact hole CH1 to form the first storage node contact plug P1 (31b, 32a). In the CMP process, for example, use was made of the polishing conditions for standard silicon oxide containing as the main components for example KOH and silica.

Next, the silicon oxide is deposited over the entire surface covering the top surface of the first storage node contact plug P1 by for example the CVD process to form a second inter-layer insulating film 22.

In the above steps, an explanation was made of the steps of opening the first storage node contact hole and forming the first storage node contact plug, but it is also preferred to simultaneously perform the steps of opening the not illustrated bit contact hole and forming the bit contact plug.

Figure 2J:
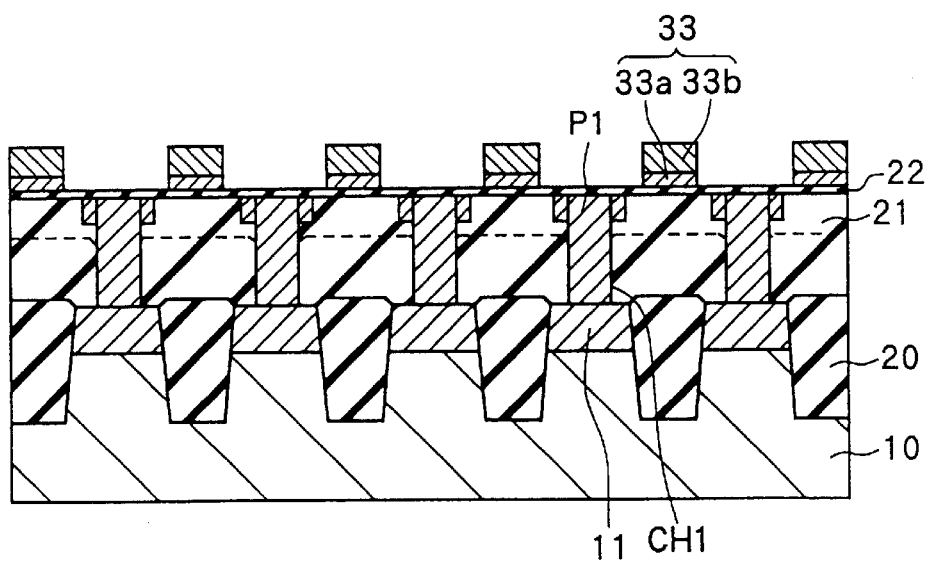
FIG. 2J shows the state up to the step of forming a bit line.

Next, as shown in FIG. 2J, polycrystalline silicon (or amorphous silicon) containing the same conductivity type conductive impurity as that of the source and drain diffusion layer 11 and tungsten silicide are deposited by for example the CVD process and processed to a pattern of the bit line to form a bit line 33 having a polycide structure of a lower bit line 33a made of polycrystalline silicon (or amorphous silicon) and an upper bit line 33b made of tungsten silicide. Here, the bit line 33 is formed so as to be connected to the not illustrated bit contact plug.

Figure 2K:
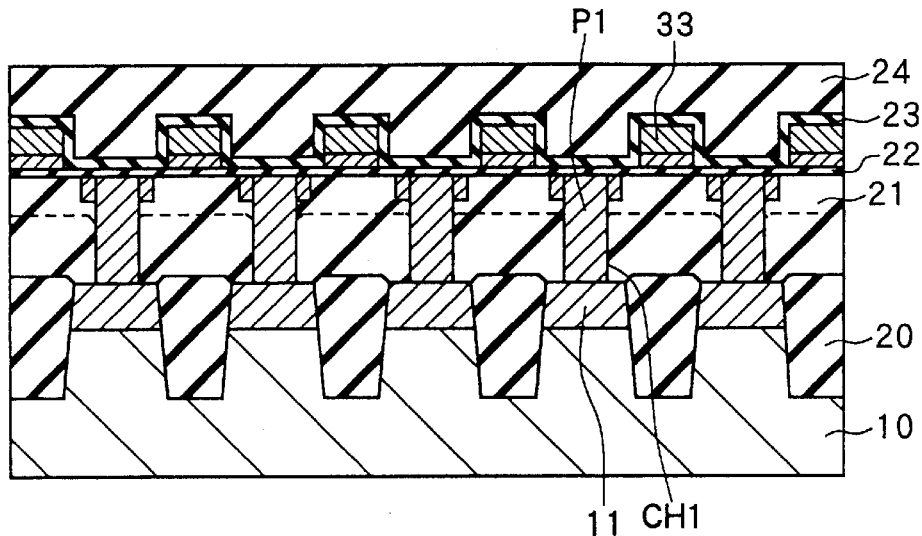
FIG. 2K shows the state up to the step of forming a fourth inter-layer insulating film.

Next, as shown in FIG. 2K, silicon nitride is deposited on the entire surface covering the bit line 33 by for example the CVD process to form a third inter-layer insulating film 23.

Next, silicon oxide is deposited by for example the CVD process to form a fourth inter-layer insulating film 24.

Figure 2L:
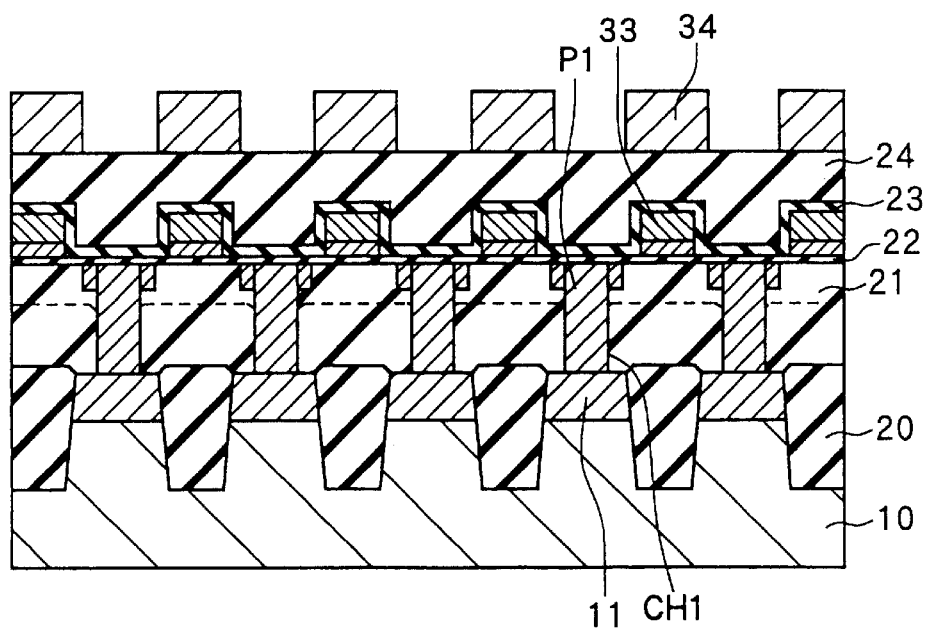
FIG. 2L shows the state up to the step of forming a second mask layer.
Figure 2M:
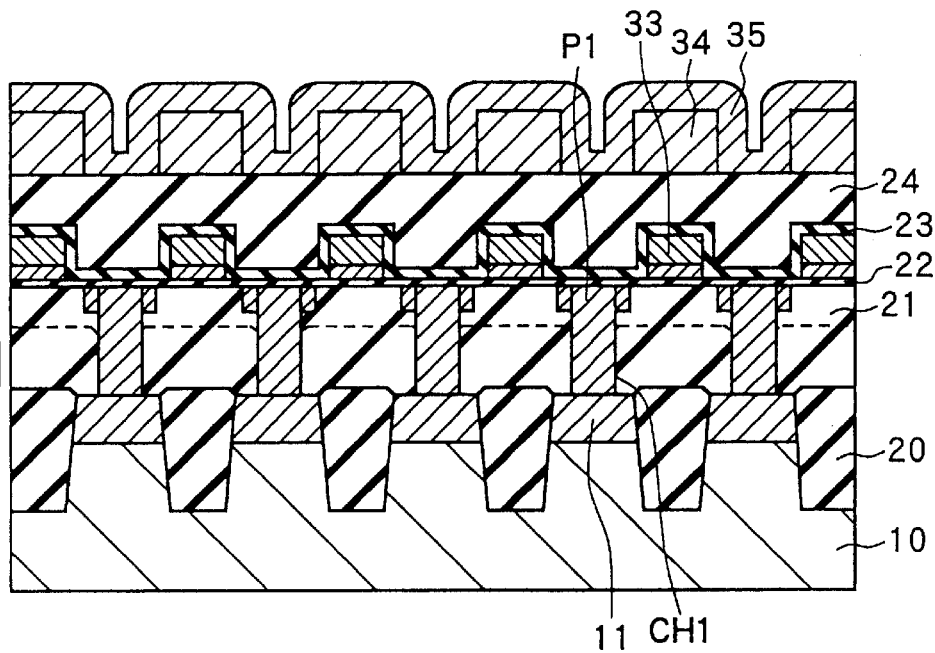
FIG. 2M shows the state up to the step of forming a layer for a second side wall mask.

Next, as shown in FIG. 2L, polycrystalline silicon (or amorphous silicon) is deposited above the fourth inter-layer insulating film 24 by for example the CVD process and processed to the pattern for opening the second storage node contact hole to form the second mask layer 24. The second mask layer 34 may or may not contain a conductive impurity Next, as shown in FIG. 2M, polycrystalline silicon (or amorphous silicon) is deposited above the second mask layer 24 by for example the CVD process to form the second side wall mask use layer 35. The second side wall mask use layer 35 may or may not contain a conductive impurity.

Figure 2N:
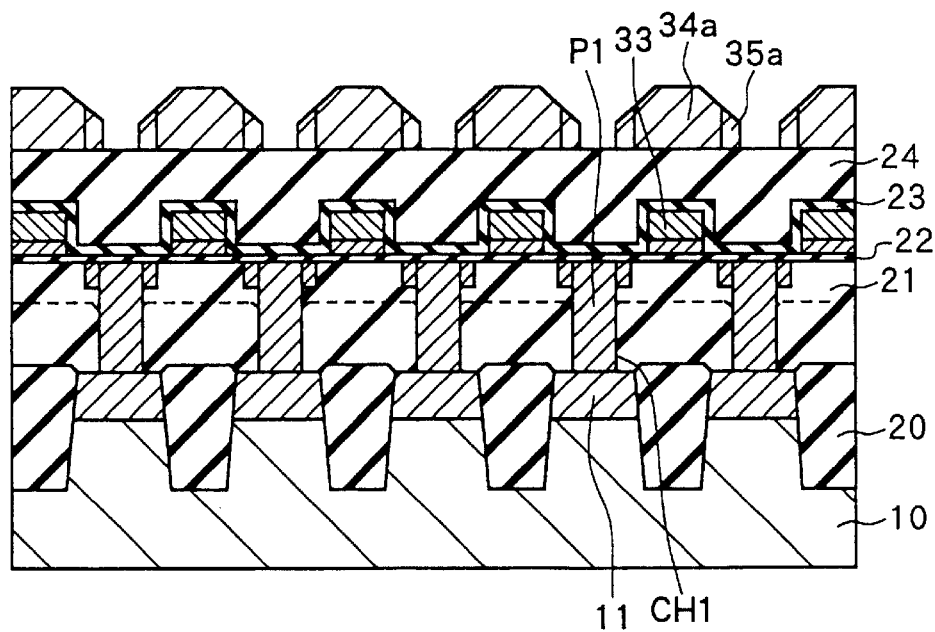
FIG. 2N shows the state up to the step of forming a second side wall mask layer.

Next, as shown in FIG. 2N, for example RIE or other etching is applied to remove the second side wall mask use layer 35 while leaving the part covering the side wall portion of the second mask layer 34 to form a second side wall mask layer 35a. At this time, the second mask layer 34a is shaped round in its shoulder portions.

Figure 2O:
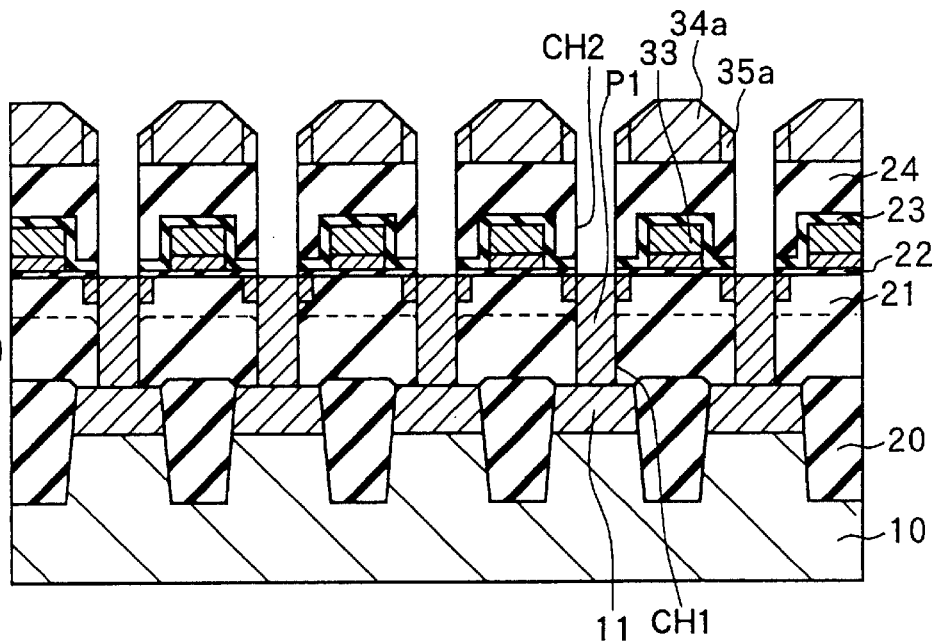
FIG. 2O shows the state up to the step of opening a second storage node contact hole.

Next, as shown in FIG. 2O, RIE or other etching is applied using the second mask layer 34a and the second side wall mask layer 35a as masks to penetrate through the second inter-layer insulating film 22, third inter-layer insulating film 23, and fourth inter-layer insulating film 24 and open the second storage node contact hole CH2 for exposing the top surface of the first storage node contact plug P1.

Figure 2P:
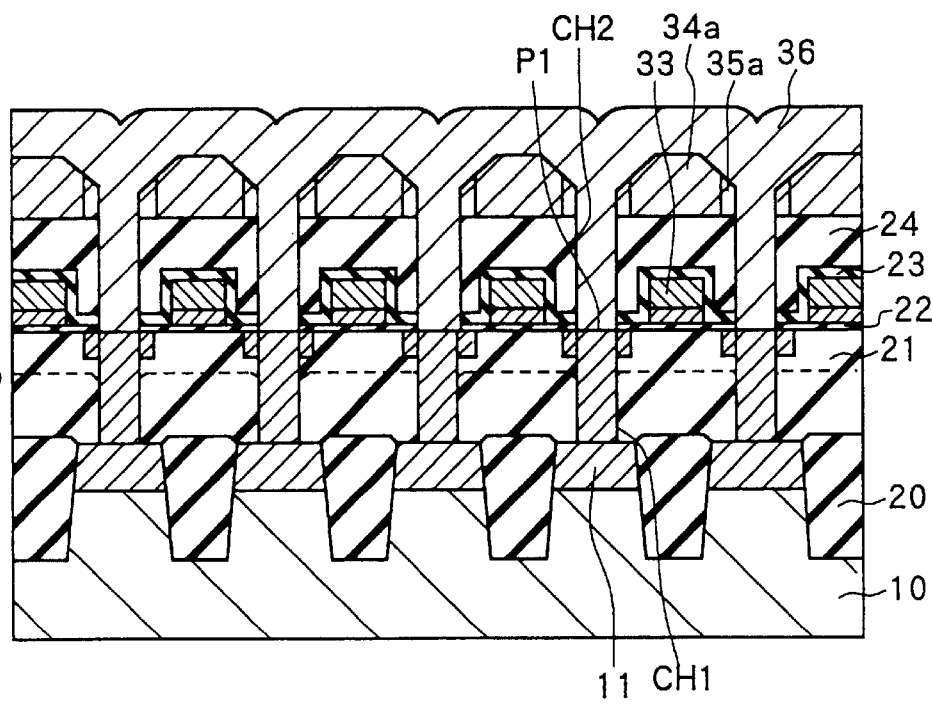
FIG. 2P shows the state up to the step of forming a layer for a second storage node contact plug.

Next, as shown in FIG. 2P, polycrystalline silicon (or amorphous silicon) containing the same conductivity type conductive impurity as that of the first storage node contact plug P1 is deposited over the entire surface by for example the CVD process while burying the second storage node contact hole CH2 so as to be connected to the first storage node contact plug P1 and thus form the second storage node contact plug use layer 36.

Figure 2Q:
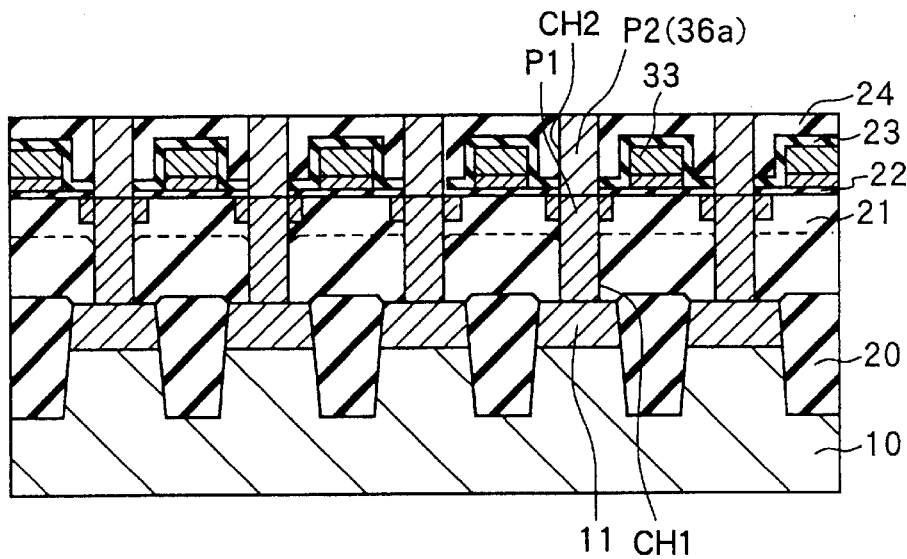
FIG. 2Q shows the state up to the step of forming a second storage node contact plug.

Next, as shown in FIG. 2Q, this is etched back by for example RIE or other etching and polished by the CMP process to remove the polycrystalline silicon (or amorphous silicon) deposited on the outside of the second storage node contact hole CH2 while leaving the inside portion of the second storage node contact hole CH2 to form the second storage node contact plug P2 (36b). Here, by removing the polycrystalline silicon or the like deposited on the outside of the second storage node contact hole CH2 by the CMP process, the second storage node contact plug P2 can be formed so that the height of the top surface of the second storage node contact plug matches with the height of the surface of the fourth inter-layer insulating film 24, so almost no plug loss occurs.

Figure 2R:
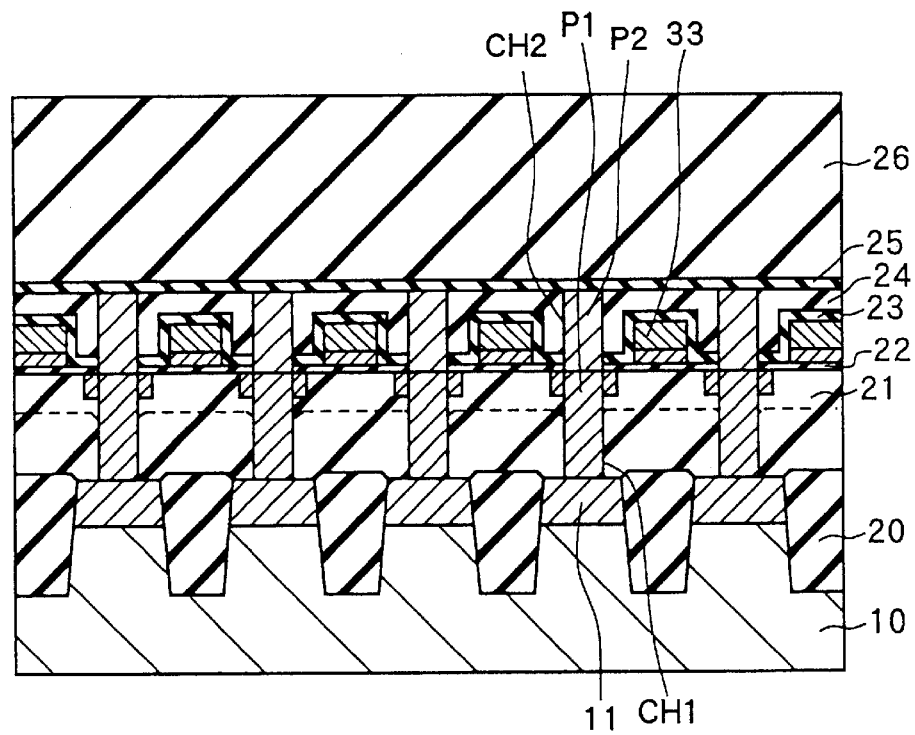
FIG. 2R shows the state up to the step of forming a layer for forming a first storage node.

Next, as shown in FIG. 2R, silicon nitride is deposited by for example the CVD process to form a fifth inter-layer insulating film 25.

Next, silicon oxide is deposited over the entire surface above the fifth inter-layer insulating film 25 by for example the CVD process to form a first storage node forming layer 26.

Figure 2S:
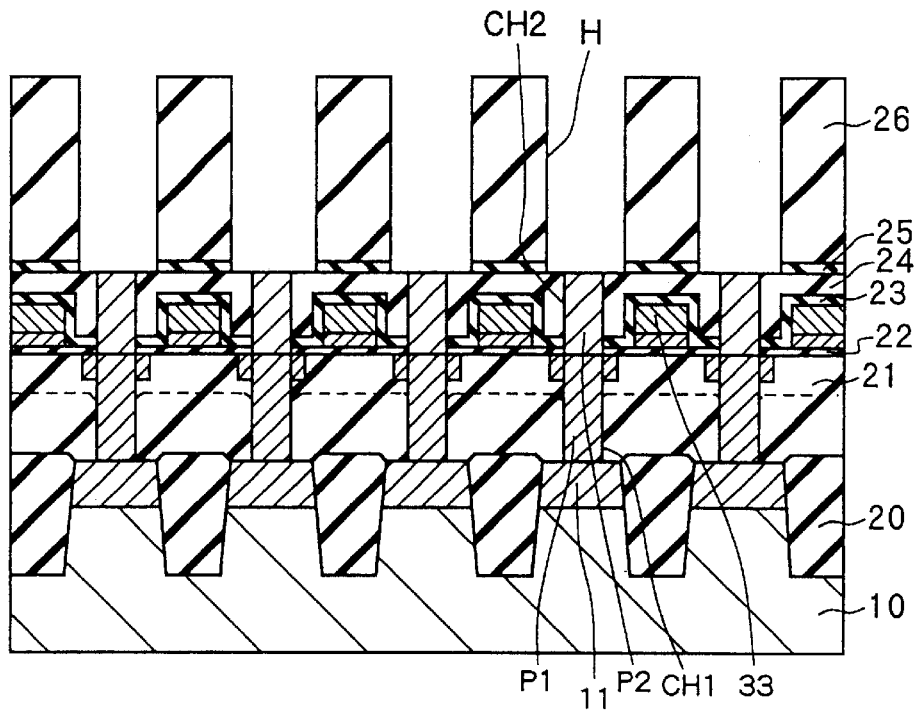
FIG. 2S shows the state up to the step of forming an opening portion acting as the mold of the storage node electrode.

Next, as shown in FIG. 2S, a resist film is formed by patterning above the first storage node forming layer 26 by photolithography and RIE or other etching applied to penetrate through the first storage node forming layer 26 and the fifth inter-layer insulating film 25 and form the opening portion H for exposing the top surface of the second storage node contact plug P2. Here, the opening portion H becomes the mold for the storage node electrode. For example, the first storage node forming layer 26 is etched under conditions of an etching gas flow rate of $C_4F_8/CO/Ar/O_2=8/150/200/3$ sccm, a pressure of 5.3 Pa, and an RF power of 1700 W, while the fifth inter-layer insulating film 25 is etched under conditions of an etching gas flow rate of $CHF_3/CO/O_2=40/160/14$ sccm, a pressure of 5.3 Pa, and an RF power of 1000 W.

Figure 2T:
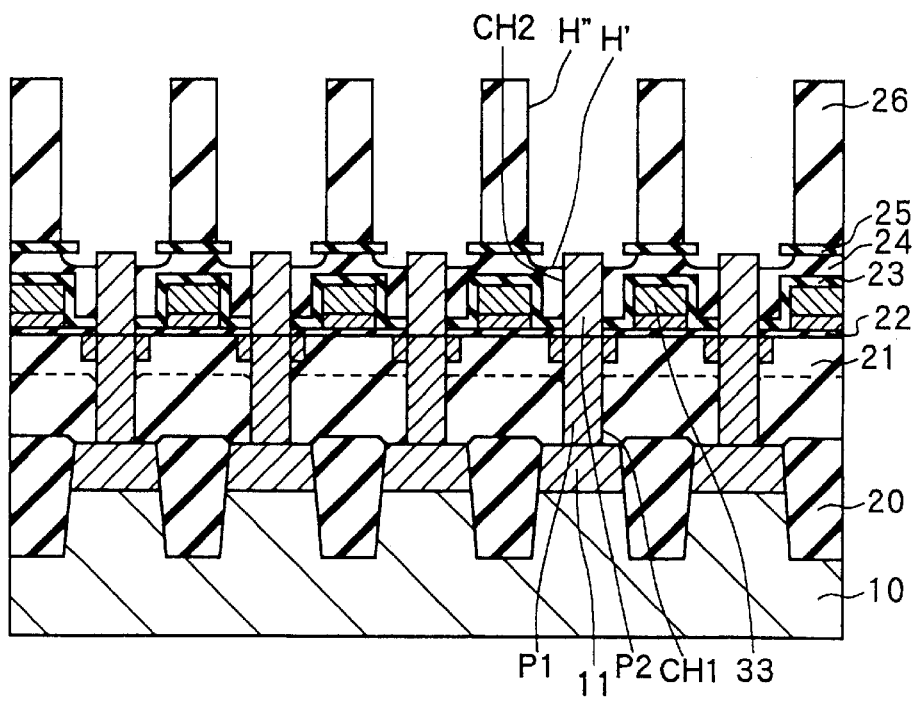
FIG. 2T shows the state up to the step of causing the bottom surface and the side wall surface of the opening portion acting as the mold of the storage node electrode to retract.

Next, as shown in FIG. 2T, for example NH$_4$F or other fluoric acid-based wet etching is used to selectively etch and remove the first storage node forming layer 26 and the fourth inter-layer insulating film 24 (silicon oxide) with respect to the fifth inter-layer insulating film 25 (silicon nitride) and cause the bottom surface H' and the side wall surface H" of the opening portion to retract. The width of the retraction is 3 nm or more converted to a thermal oxide film and 5 nm or more converted to a CVD film. The upper limit is about a half of the minimum design dimension of the generation used.

At this time, at the bottom surface of the opening portion, the second storage node contact plug P2 is shaped to project out into the opening portion. Further, at the side wall surface of the opening portion, the fifth inter-layer insulating film 25 is shaped to project out into the opening portion.

Figure 2U:
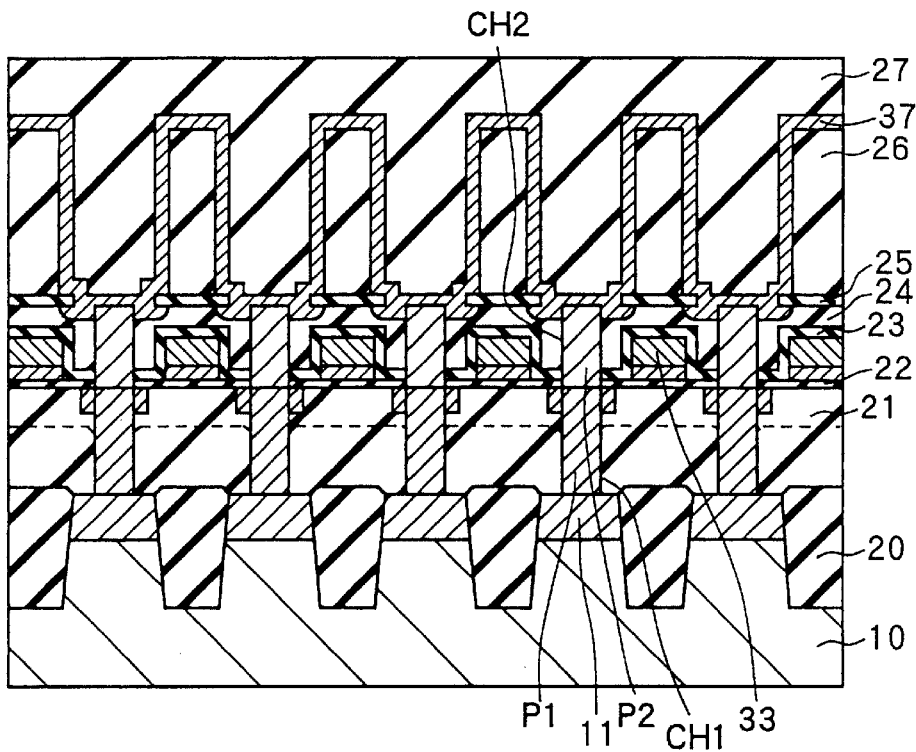
FIG. 2U shows the state up to the step of forming a layer for forming a second storage node.

Next, as shown in FIG. 2U, polycrystalline silicon or amorphous silicon containing phosphorus or another conductive impurity is deposited over the entire surface while covering the interior of the opening portion acting as the mold of the storage node electrode by for example the CVD process to form a storage node electrode use layer 37 connected to the second storage node contact plug P2.

At this time, at the bottom surface of the opening portion, the second storage node contact plug P2 is shaped to project out into the opening portion, so the storage node electrode use layer 37 and the second storage node contact plug P2 can be connected at the top surface and the side surface of the second storage node contact plug P2. It therefore becomes possible to reliably connect the storage node electrode use layer 37 and the second storage node contact plug P2.

Further, at the side wall surface of the opening portion, the fifth inter-layer insulating film 25 is shaped to project out into the opening portion, so the storage node electrode use layer 37 and the fifth inter-layer insulating film 25 can be formed so as to contact each other at the top surface and the side surface of the fifth inter-layer insulating film 25.

Next, silicon oxide is deposited above the storage node electrode use layer 37 while burying the opening portion acting as the mold of the storage node electrode by for example the CVD process to form a second storage node forming layer 27.

Figure 2V:
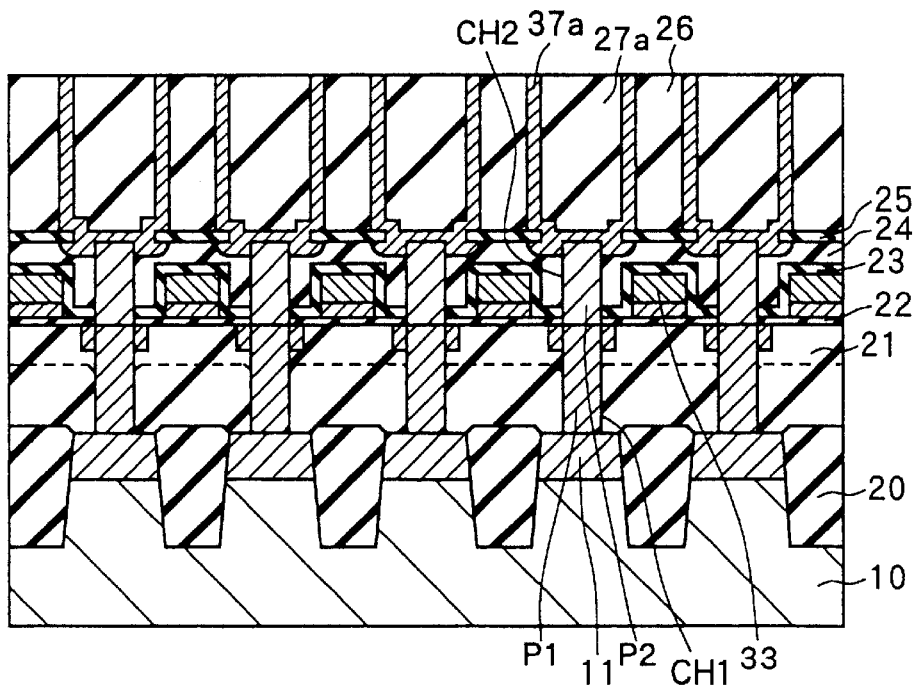
FIG. 2V shows the state up to the step of dividing the storage node electrode.

Next, as shown in FIG. 2V, for example, the second storage node forming layer 27 and the storage node electrode use layer 37 are sequentially etched back from above or polished from above by a CMP process to obtain the individually divided storage node electrode 37a and second storage node electrode forming layer 27a.

Figure 2W:
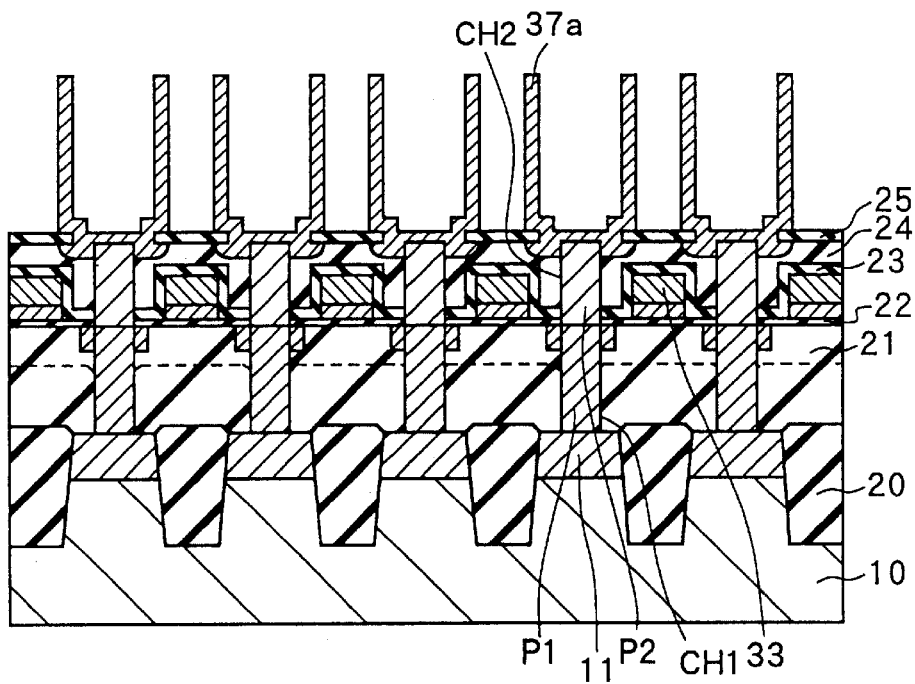
FIG. 2W shows the state up to the step of removing the layer for forming the first and second storage nodes.

Next, as shown in FIG. 2W, for example fluoric acid-based wet etching is applied to remove the first storage node forming layer 26 and the second storage node forming layer 27a.

At this time, since the storage node electrode use layer 37 and the fifth inter-layer insulating film 25 were formed so as to contact each other at the top surface and the side surface of the fifth inter-layer insulating film 25, the storage node electrode use layer 37 and the fifth inter-layer insulating film 25 can be brought into contact without any gap, and the fifth inter-layer insulating film 25 acts as an etching stopper without permeation of the etchant into the fourth inter-layer insulating film 24.

Figure 2X:
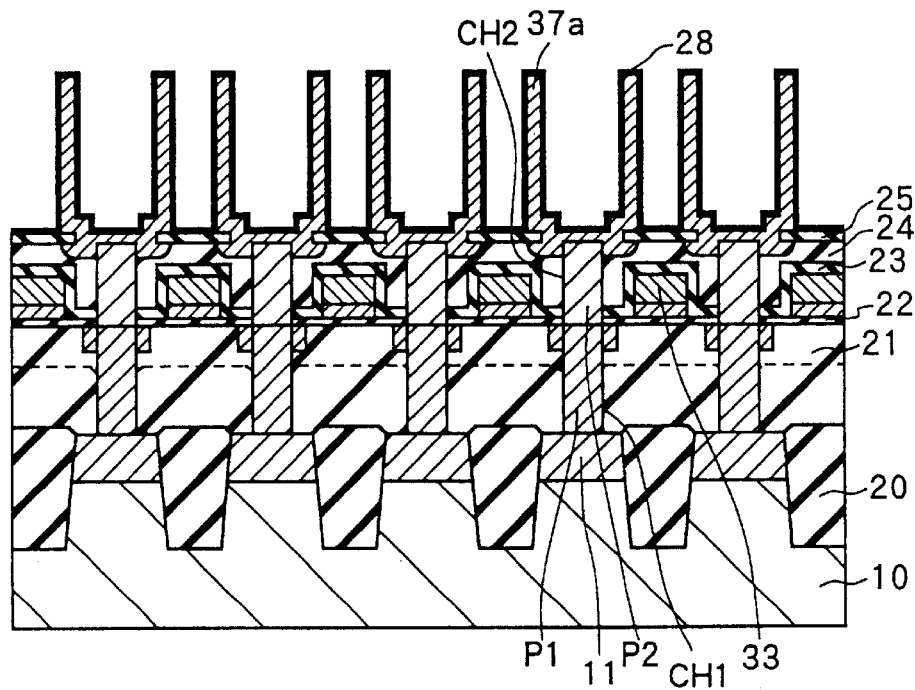

Next, as shown in FIG. 2X, for example, the natural oxide film at the surface of the storage node electrode 37a is removed by fluoric acid-based wet etching, then a silicon nitride layer is formed by the RTN process and a low pressure CVD process and a silicon oxide layer is formed on the outside layer of the silicon nitride layer by thermal oxidation to form a capacitor insulating film 28 made of an NO film (stacked insulating film of nitride film and oxide film) for covering the storage node electrode 37a. Alternatively, it is also possible to use a material such as tantalum oxide as the capacitor insulating film.

Next, polycrystalline silicon (or amorphous silicon) containing the same conductivity type conductive impurity as that of the storage node electrode 37a is deposited by for example the CVD process to form the plate electrode 38, whereby a capacitor having the structure shown in FIGS. 1A and 2B is completed. As the following steps, an upper insulating film is formed over the entire surface while covering the capacitor etc., upper interconnections are formed according to need, and so on, whereby the intended semiconductor memory device is produced.

According to the method for producing a semiconductor memory device of the present embodiment, it is possible to produce a semiconductor memory device having a high quality storage node electrode and storage node contact plug enabling the prevention of connection failure between the storage node contact plug and the storage node electrode, the prevention of the removal of the insulating film below the etching stopper, which was a cause of short-circuiting, etc.

Figure 3A:
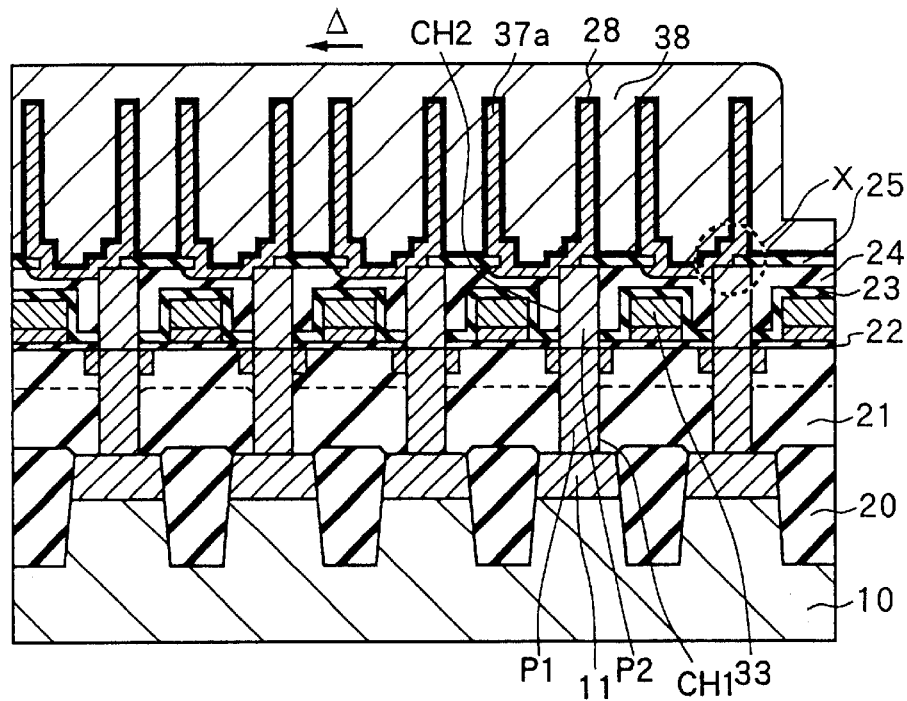
FIG. 3A is a sectional view of the case in the embodiment where the pattern of formation of the storage node electrodes is off.
Figure 3B:
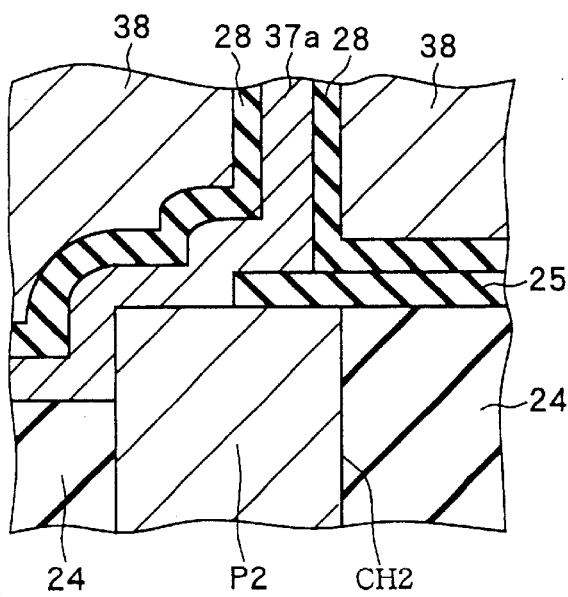
FIG. 3B is an enlarged view of the region X in FIG. 3A.

For example, as shown in the sectional view of FIG. 3A and the enlarged view of the region X in FIG. 3A of FIG. 3B, even in the case where the opening portion H acting as the mold of the storage node electrode formed in the first storage node forming layer 26 is formed deviated to the left of the figure by the amount of the distance A, the storage node electrode use layer 37 and the fifth inter-layer insulating film 25 can be brought into contact without a gap, and it is possible to produce the semiconductor memory device stably without permeation of the etchant into the fourth inter-layer insulating film 24.

In the method for producing the semiconductor memory device of the present embodiment, it is possible to reduce the thickness of the fifth inter-layer insulating film (silicon nitride film) as the etching stopper film and possible to reduce the total thickness of the inter-layer insulating films. By making the etching stopper film thinner, a reduction of the stress of the insulating film can be realized, thus a DRAM with little crystal failure, for example, little retention characteristic, can be produced.

Further, the aspect ratio of the contacts around the memory cells is lowered and miniaturization becomes easy, which makes this suited to mixed mounting of a DRAM and logic circuit.

Further, it is possible to make the storage node electrode a size more than the resolution of lithography, so a large storage capacity Cs can be secured and the height of the capacitor can be lowered and therefore the step difference due to the capacitor can be reduced. As a result, a further reduction of the thickness of the insulating film is possible, the aspect ratio of the contacts around the memory cells is further lowered, and further miniaturization becomes easy, which makes this further suited to mixed mounting of a DRAM and logic circuit.

The method for producing a semiconductor memory device of the present invention can be applied to any semiconductor memory device having a capacitor (storage node) such as a DRAM or VRAM having a memory capacitor.

The method for producing a semiconductor memory device of the present invention is not limited to the embodiment. For example, as the storage node electrode, amorphous silicon or polycrystalline silicon can be used.

As the shape of the capacitor, other than the cylinder type, various shapes such as the stack type and the fin type can be applied.

Further, the structure, production method, etc. of the transistor part are not particularly limited. It is possible to adopt a variety of structures for example a polycide or other gate electrode or a source and drain diffusion layer of the LDD structure.

Further, mixed mounting with a logic LSI or other semiconductor element or device is possible. In addition, various modifications are possible within a range not out of the gist of the present invention.

Summarizing the effects of the invention, the semiconductor memory device of the present invention is a semiconductor memory device having a high quality storage node electrode and storage node contact plug enabling prevention of connection failure between the storage node contact plug and the storage node electrode, prevention of the removal of the insulating film below the etching stopper, which is a cause of short-circuiting, etc.

Further, according to the method for producing a semiconductor memory device of the present invention, the semiconductor memory device of the present invention described above can be easily produced. That is, a semiconductor memory device having a high quality storage node electrode and storage node contact plug enabling prevention of connection failure between the storage node contact plug and the storage node electrode, prevention of the removal of the insulating film below the etching stopper, which is a cause of short-circuiting, etc. can be produced.

What is claimed is:

1. A semiconductor memory device comprising a plurality of memory cells each having a memory capacitor having a storage node electrode and a transistor, comprising:

a substrate, a transistor formed on said substrate, a first insulating film formed on said substrate covering said transistor, a storage node contact hole formed in said first insulating film and reaching a source and drain region of said transistor, a storage node contact plug buried in said storage node contact hole, a storage node electrode formed connected to said storage node contact plug, a second insulating film formed above said first insulating film in the gap portion of said storage node electrodes, a capacitor insulating film formed above said storage node electrode, and a plate electrode formed above said capacitor insulating film, said storage node electrode and said storage node contact plug being formed connected at least at part of the top surface and side surface of said storage node contact plug, and said storage node electrode and said second insulating film being formed in contact at least at part of the top surface and the side surface of said second insulating film.

2. A semiconductor memory device as set forth in claim 1, wherein:

a bit line is formed above the transistor through an insulating film and said transistor and said bit line are covered by said first insulating film.

3. A semiconductor memory device as set forth in claim 1, wherein said storage node electrode comprises a cylinder type storage node electrode.

4. A semiconductor memory device comprising a plurality of memory cells each having a memory capacitor having a storage node electrode and a transistor, comprising:

a substrate, a transistor formed on said substrate, a first insulating film formed on said substrate covering said transistor, a storage node contact hole formed on said insulating film and reaching the source and drain region of said transistor, a storage node contact plug buried in said storage node contact hole, a storage node electrode formed connected to said storage node contact plug, a second insulating film formed above said first insulating film in the gap of said storage node electrode, a capacitor insulating film formed above said storage node electrode, and a plate electrode formed above said capacitor insulating film, said storage node electrode and said second insulating film being formed in contact at least at part of the top surface and the side surface of said second insulating film.

5. A semiconductor memory device as set forth in claim 4, wherein:

a bit line is formed above the transistor through an insulating film and said transistor and said bit line are covered by said first insulating film.

6. A semiconductor memory device as set forth in claim 4, wherein said storage node electrode comprises a cylinder type storage node electrode.

* * * * *